(12) United States Patent
Hong

(10) Patent No.: US 11,903,283 B2
(45) Date of Patent: Feb. 13, 2024

(54) DISPLAY APPARATUS COMPRISING DIFFERENT TYPES OF THIN FILM TRANSISTORS WITH COMPACT DESIGN AND METHOD FOR MANUFACTURING THE SAME

(71) Applicant: LG Display Co., Ltd., Seoul (KR)

(72) Inventor: Yewon Hong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/103,848

(22) Filed: Jan. 31, 2023

(65) Prior Publication Data

US 2023/0180558 A1 Jun. 8, 2023

Related U.S. Application Data

(62) Division of application No. 17/119,596, filed on Dec. 11, 2020, now Pat. No. 11,600,683.

(30) Foreign Application Priority Data

Dec. 24, 2019 (KR) .................... 10-2019-0174008

(51) Int. Cl.
*H10K 59/131* (2023.01)
*H01L 29/786* (2006.01)
*H10K 71/00* (2023.01)

(52) U.S. Cl.
CPC ....... *H10K 59/131* (2023.02); *H01L 29/7869* (2013.01); *H10K 71/00* (2023.02)

(58) Field of Classification Search
CPC .. H10K 59/12; H10K 59/1201; H10K 59/121; H10K 59/1213; H10K 59/1216; H10K 59/131; H10K 71/00; H10K 71/40; H10K 71/421; H10K 71/441; H01L 29/7869
USPC .......................................................... 257/40
See application file for complete search history.

(56) References Cited

U.S. PATENT DOCUMENTS

2018/0190824 A1* 7/2018 Bae .................. H01L 29/45
2020/0089069 A1* 3/2020 Morinaga ............ G02F 1/1368
2021/0020110 A1* 1/2021 Park .................. H10K 59/1213

FOREIGN PATENT DOCUMENTS

KR 10-2014-0092137 A 7/2014
KR 10-2015-0101396 A 9/2015

* cited by examiner

*Primary Examiner* — Matthew E. Gordon
(74) *Attorney, Agent, or Firm* — Birch, Stewart, Kolasch & Birch, LLP

(57) ABSTRACT

A method for manufacturing a display apparatus can include providing a first gate electrode on a substrate; providing a first active layer which overlaps with a portion of the first gate electrode; providing a second active layer on the substrate spaced apart from the first active layer; providing a first source electrode and a first drain electrode connected with the first active layer; providing a second gate electrode which overlaps with at least a portion of the second active layer; providing a second source electrode and a second drain electrode connected with the second active layer. Also, the method includes selectively providing conductivity to the second active layer, in which the first source electrode, the first drain electrode, the second gate electrode, the second source electrode, and the second drain electrode are manufactured at a same time.

15 Claims, 15 Drawing Sheets

US 11,903,283 B2

DISPLAY APPARATUS COMPRISING DIFFERENT TYPES OF THIN FILM TRANSISTORS WITH COMPACT DESIGN AND METHOD FOR MANUFACTURING THE SAME

CROSS-REFERENCE TO RELATED APPLICATIONS

This application is a Divisional application of U.S. patent application Ser. No. 17/119,596 filed on Dec. 11, 2020, which claims priority to the Korean Patent Application No. 10-2019-0174008 filed on Dec. 24, 2019 in the Republic of Korea, where the entire contents of all these applications are hereby expressly incorporated by reference into the present application.

BACKGROUND

Field of the Invention

The present disclosure relates to a display apparatus comprising different types of thin film transistors and a method for manufacturing the same. In more detail, the present disclosure relates to a display apparatus comprising a bottom gate type thin film transistor and a top gate type thin film transistor and a method for manufacturing the same.

Discussion of the Related Art

A thin film transistor can be manufactured on a glass substrate or a plastic substrate, whereby the thin film transistor is widely used as a switching device or a driving device in a display apparatus such as a liquid crystal display apparatus or an organic light emitting display apparatus.

According to a material used for an active layer, the thin film transistor can be largely categorized into an amorphous silicon thin film transistor having an active layer of amorphous silicon, a polycrystalline silicon thin film transistor having an active layer of polycrystalline silicon, and an oxide semiconductor thin film transistor having an active layer of oxide semiconductor.

The oxide semiconductor thin film transistor (Oxide semiconductor TFT), which has high mobility and has a large resistance change in accordance with an oxygen content, is advantageous in that it facilitates to obtain desired properties. Also, an active layer of oxide is formed at a relatively low temperature for a process of manufacturing the oxide semiconductor thin film transistor, whereby it is possible to lower a manufacturing cost. Also, owing to the properties of oxide, an oxide semiconductor is transparent, whereby it is favorable to realization of a transparent display apparatus.

The display apparatus includes a display area for displaying an image, and a non-display area on which an image is not displayed. A function of the display area is different from a function of the non-display area, whereby a function of a thin film transistor disposed in the display area is different from a function of a thin film transistor disposed in the non-display area.

SUMMARY OF THE DISCLOSURE

The present disclosure has been made in view of the above problems and other limitations associated with the related art, and it is an object of the present disclosure to provide a display apparatus in which thin film transistors having the different driving properties are respectively disposed in a display area and a non-display area for improvement of efficiency.

It is another object of the present disclosure to provide a display apparatus in which a bottom gate type thin film transistor and a top gate type thin film transistor are respectively disposed in a display area and a non-display area for improvement of efficiency.

It is a further object of the present disclosure to provide a display apparatus in which a bottom gate type thin film transistor which occupies a small sized area is disposed in a display area for realizing a high resolution, and a top gate type thin film transistor capable of preventing an occurrence of parasitic cap and enabling a small power consumption is disposed in a non-display area which consumes a large amount of power.

In accordance with an aspect of the present disclosure, the above and other objects can be accomplished by the provision of a display apparatus comprising a display area for displaying an image, and a non-display area on which an image is not displayed, wherein the display area includes a first thin film transistor, and the non-display area includes a second thin film transistor, wherein the first thin film transistor includes a first gate electrode on a substrate, a first active layer on the first gate electrode, and a first source electrode and a first drain electrode which are spaced apart from each other, and are respectively connected with the first active layer, and wherein the second thin film transistor includes a second active layer on the substrate, a second gate electrode on the second active layer, and a second source electrode and a second drain electrode which are spaced apart from each other, and are respectively connected with the second active layer, wherein the first active layer and the second active layer include an oxide semiconductor material, the first gate electrode is disposed between the substrate and the first active layer, and the second active layer is disposed between the substrate and the second gate electrode.

The first active layer and the second active layer are disposed on the same layer.

The second source electrode and the second drain electrode are disposed on the same layer as that of the second gate electrode.

Any one of the second source electrode and the second drain electrode is in contact with a lower wiring which is disposed on the same layer as that of the first gate electrode.

The other of the second source electrode and the second drain electrode is in contact with an upper wiring which is disposed on the same layer as that of the second gate electrode.

The display apparatus further comprises a first gate insulating film between the first active layer and the first gate electrode, and a second gate insulating film between the second active layer and the second gate electrode, between the second active layer and the second source electrode, and between the second active layer and the second drain electrode.

The second gate insulating film is not disposed on the second active layer between the second source electrode and the second gate electrode and between the second drain electrode and the second gate electrode.

At least one of the first active layer and the second active layer includes a first oxide semiconductor layer, and a second oxide semiconductor layer on the first oxide semiconductor layer.

In accordance with another aspect of the present disclosure, there is provided a method for manufacturing a display apparatus comprising providing a first gate electrode on a substrate, providing a first active layer which is spaced apart from the first gate electrode and overlaps with at least a portion of the first gate electrode, providing a second active layer on the substrate, wherein the second active layer is spaced apart from the first active layer, providing a first source electrode and a first drain electrode which are spaced apart from each other and are respectively connected with the first active layer, providing a second gate electrode which is spaced apart from the second active layer and overlaps with at least a portion the second active layer, providing a second source electrode and a second drain electrode which are spaced apart from each other and are respectively connected with the second active layer, and selectively providing conductivity to the second active layer, wherein the first source electrode, the first drain electrode, the second gate electrode, the second source electrode, and the second drain electrode are manufactured at the same time.

The first active layer and the second active layer are formed of an oxide semiconductor material.

At least one of the first active layer and the second active layer includes a first oxide semiconductor layer, and a second oxide semiconductor layer on the first oxide semiconductor layer.

Providing the first active layer and providing the second active layer can be carried out at the same time.

The method further comprises providing a first gate insulating film before providing the first active layer, after providing the first gate electrode, and providing a second gate insulating film before providing the second gate electrode, the second source electrode, and the second drain electrode, after providing the second active layer.

The second gate insulating film is removed from the area above the second active layer between the second source electrode and the second gate electrode and between the second drain electrode and the second gate electrode.

BRIEF DESCRIPTION OF THE DRAWINGS

The above and other objects, features and other advantages of the present disclosure will be more clearly understood from the following detailed description taken in conjunction with the accompanying drawings. In the drawings.

DETAILED DESCRIPTION OF THE EMBODIMENTS

Figure 1:
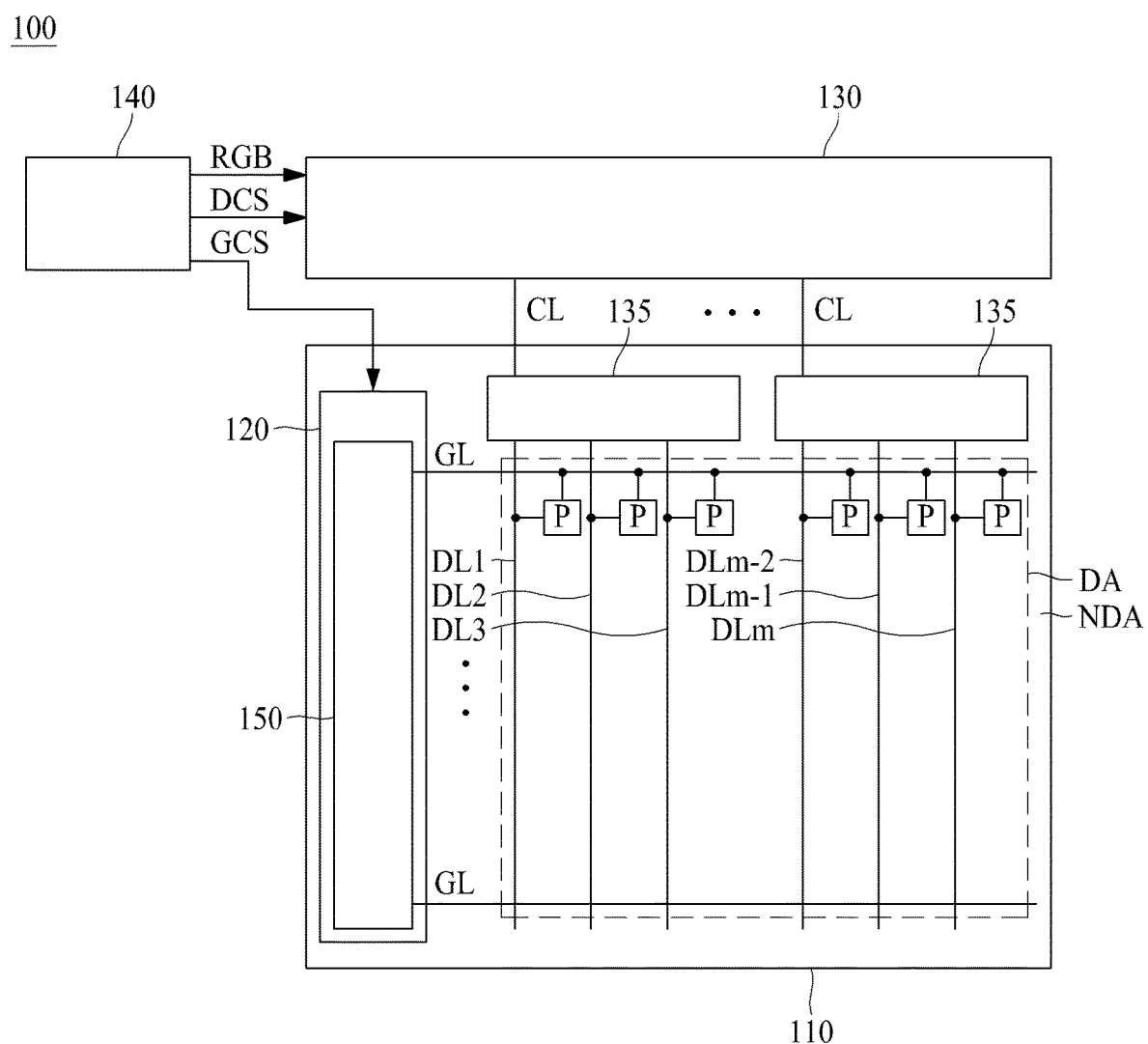
FIG. 1 is a schematic view illustrating a display apparatus according to one embodiment of the present disclosure.

Advantages and features of the present disclosure, and implementation methods thereof will be clarified through the following embodiments, described with reference to the accompanying drawings. The present disclosure can, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part can also be present unless "only" is used. The terms in a singular form can include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween can be included, unless "just" or "direct" is used.

If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent,"

"next," and "before," a case which is not continuous can be included, unless "just" or "direct" is used.

It will be understood that, although the terms "first," "second," etc. can be used herein to describe various elements, these elements should not be limited by these terms and may not define order. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode can be the drain electrode, and the drain electrode can be the source electrode. Also, the source electrode in any one embodiment of the present disclosure can be the drain electrode in another embodiment of the present disclosure, and the drain electrode in any one embodiment of the present disclosure can be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region can be a source electrode, and a drain region can be a drain electrode. Also, a source region can be a drain electrode, and a drain region can be a source electrode.

FIG. 1 is a schematic view illustrating a display apparatus 100 according to one embodiment of the present disclosure. All the components of the display apparatus according to all embodiments of the present disclosure are operatively coupled and configured.

As shown in FIG. 1, the display apparatus 100 according to one embodiment of the present disclosure includes a display panel 110, a gate driver 120, a data driver 130, and a controller 140.

The display panel 110 includes gate lines (GL) and data lines (DL), and a plurality of pixels (P) each arranged at a crossing portion of the corresponding gate line (GL) and the corresponding data line (DL). Each pixel (P) includes a display device 710, and a pixel driver (PDC) configured to drive the display device 710. An image is displayed on the display panel 110 by driving the pixel (P).

The display panel 110 can be divided into a display area (DA) and a non-display area (NDA). The display area (DA) corresponds to the area for displaying an image, and the non-display area (NDA) corresponds to the area on which an image is not displayed. According to one embodiment of the present disclosure, an image can include a static image without any motion, and a moving image with a motion. The pixel (P) is disposed in the display area (DA).

The controller 140 controls the gate driver 120 and the data driver 130.

The controller 140 outputs a gate control signal (GCS) for controlling the gate driver 120, and a data control signal (DCS) for controlling the data driver 130 by the use of vertically/horizontally synchronized signal and clock signal supplied from an external system. Also, the controller 140 samples input video data, which is provided from the external system, and then re-aligns the sampled video data, and supplies the re-aligned video data (RGB) to the data driver 130.

The gate control signal (GCS) includes a gate start pulse (GSP), a gate shift clock (GSC), a gate output enable signal (GOE), a start signal (Vst), and a gate clock (GCLK). Also, control signals for controlling a shift register can be included in the gate control signal (GCS).

The data control signal (DCS) includes a source start pulse (SSP), a source shift clock signal (SSC), a source output enable signal (SOE), and a polarity control signal (POL).

The data driver 130 supplies a data voltage to the data lines (DL) of the display panel 110. In detail, the data driver 130 converts the video data (RGB) provided from the controller 140 into the data voltage, and supplies the data voltage to the data lines (DL).

The gate driver 120 sequentially supplies a gate pulse (GP) to the gate lines (GL) for 1 frame period. Herein, '1 frame' indicates the period in which an image is output through the use of display panel 110. Also, the gate driver 120 supplies a gate-off signal for turning off a switching device to the gate line (GL) for the remaining period of 1 frame in which the gate pulse (GP) is not supplied.

According to one embodiment of the present disclosure, the gate driver 120 can be provided in the display panel 110. A structure of directly providing the gate driver 120 on the display panel 110 can be referred to as Gate-In-Panel (GIP) structure.

Referring to FIG. 1, the gate driver 120 provided in the display panel 110 includes a shift register 150. The shift register 150 generates and supplies the gate pulse (GP).

The shift register 150 sequentially supplies the gate pulse (GP) to the gate lines (GL) for 1 frame by the use of start signal (Vst) and gate clock (GCLK) transmitted from the controller 140. The gate pulse (GP) has a turn-on voltage capable of turning on the switching device (thin film transistor) provided in the pixel (P).

The shift register 150 supplies the gate-off signal capable of turning off the switching device to the gate line (GL) for the remaining period of 1 frame in which the gate pulse (GP) is not supplied. Hereinafter, the gate pulse (GP) and the gate-off signal (Goff) are totally referred to as a scan signal (SS).

Figure 2:
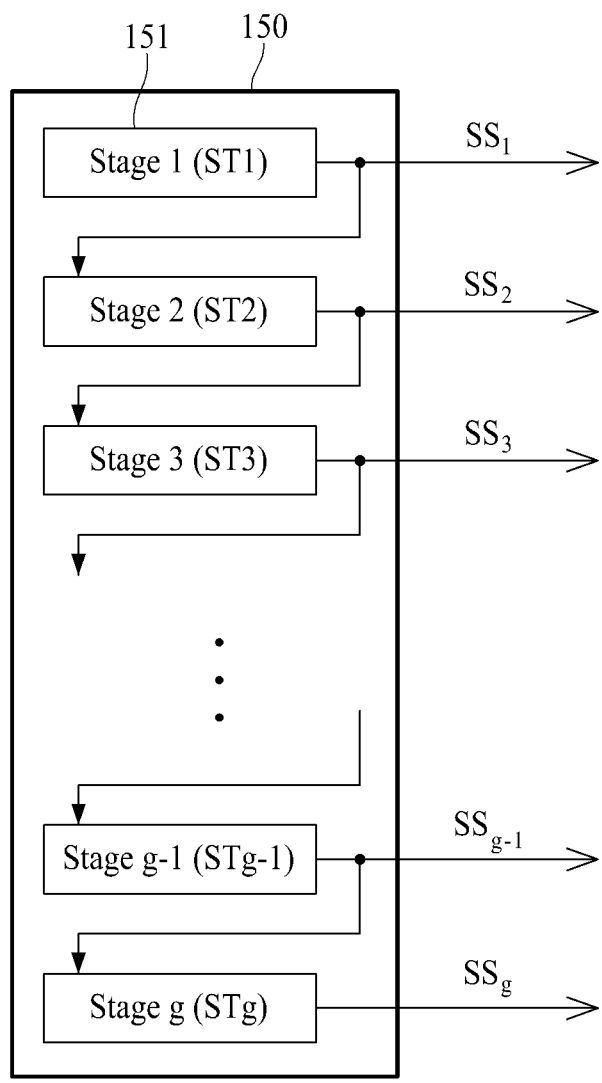
FIG. 2 is a schematic view illustrating an example of a shift register of the display apparatus.
Figure 3:
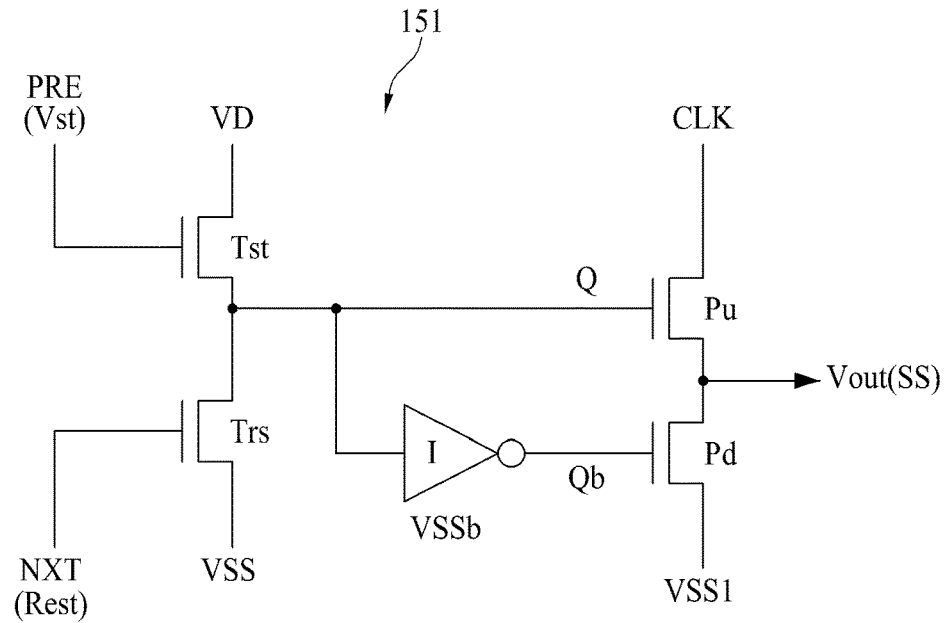
FIG. 3 is a circuit diagram illustrating a stage included in the shift register of FIG. 2.

FIG. 2 is a schematic view illustrating the shift register 150. FIG. 3 is a circuit diagram illustrating a stage 151 included in the shift register 150 of FIG. 2.

The shift register 150 according to one embodiment of the present disclosure includes 'g' stages 151 (ST1 to STg), as shown in FIG. 2.

The shift register 150 transmits one scan signal (SS) to the pixels (P) connected with one gate line (GL) through one gate line (GL). Each of the stages 151 is connected with one gate line (GL). If 'g' gate lines (GL) are provided in the display panel 110, the shift register 150 includes 'g' stages (ST1 to STg) 151, and generates 'g' scan signals (SS1 to SSg).

Generally, each stage 151 outputs the gate pulse (GP) once for 1 frame, and the gate pulse (GP) is sequentially output from each stage 151.

Each of the stages 151 which sequentially output the scan signal (SS), as shown in FIG. 3, includes a pull-up transistor (Pu), a pull-down transistor (Pd), a start transistor (Tst), a reset transistor (Trs), and an inverter (I).

The pull-up transistor (Pu) is turned-on or turned-off in accordance with a logic state of Q node. If the pull-up transistor (Pu) is turned-on, the clock signal (CLK) is supplied to the pull-up transistor (Pu), and the pull-up transistor (Pu) outputs the gate pulse (GP) [Vout(SS)].

The pull-down transistor (Pd) is connected between the pull-up transistor (Pu) and a turn-off voltage (VSS1). When the pull-up transistor (Pu) is turned-on, the pull-down transistor (Pd) is turned-off. When the pull-up transistor (Pu) is turned-off, the pull-down transistor (Pd) is turned-on, whereby the gate-off signal (Goff) is output.

An output (Vout) of the stage 151 includes the gate pulse (GP) and the gate-off signal (Goff). The gate pulse (GP) has a high level voltage, and the gate-off signal (Goff) has a low level voltage.

The start transistor (Tst) charges the Q node with a high level voltage (VD) in response to a prior output (PRE) from a prior stage. When the corresponding stage 151 is the first stage (ST1), the start pulse (Vst) instead of the prior output (PRE) is supplied thereto.

The reset transistor (Trs) discharges a low potential voltage (VSS) corresponding to a reset voltage into the Q node in response to a next output (NXT) of the next stage. When the corresponding stage 151 is the last stage (STg), a reset pulse (Rest) instead of the next output (NXT) is supplied thereto.

Generally, a control signal which is provided to a gate terminal of the reset transistor (Trs) maintains a low state when the Q node is a high state.

If the high-level signal is provided to the Q node, the pull-up transistor (Pu) is turned-on so that the pull-up transistor (Pu) outputs the gate pulse (GP). In this case, if the reset transistor (Trs) is turned-off, the low potential voltage (VSS) is not supplied to the reset transistor (Trs).

When the gate pulse (GP) is output, the control signal of the high level is provided to the gate terminal of the reset transistor (Trs), whereby the reset transistor (Trs) is turned-on, and the pull-up transistor (Pu) is turned-off. As a result, the gate pulse (GP) is not output through the pull-up transistor (Pu).

When the gate pulse (GP) is not generated, the inverter (I) transmits Qb node control signal for generating the gate-off signal (Goff) to the pull-down transistor (Pd) through the Qb node.

The data voltage is output to the data lines (DL) every 1 horizontal period by the turn-on voltage capable of turning on the switching device of each pixel (P) connected with the gate line (GL), and the gate-off signal (Goff) for maintaining the turn-off state of the switching device is provided to the gate line (GL) for the remaining period of 1 frame except 1 horizontal period.

To this end, the inverter (I) transmits the Qb node control signal to the pull-down transistor (Pd) through the Qb node for the remaining period of 1 frame except 1 horizontal period.

The pull-down transistor (Pd) is turned-on by the Qb node control signal supplied from the inverter (I), whereby the gate-off signal (Goff) is output to the gate line (GL).

Figure 4:
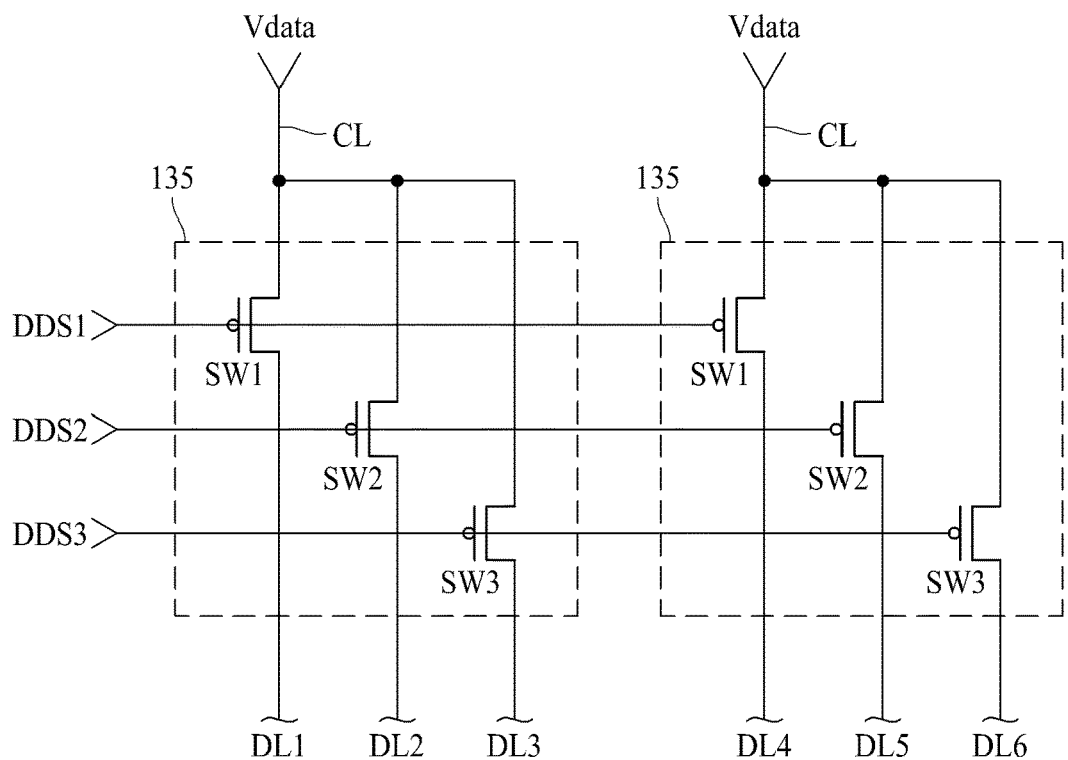
FIG. 4 is a circuit diagram for a data signal distribution circuit.

FIG. 4 is a circuit diagram for a data signal distribution circuit 135.

Referring to FIG. 1, the data signal distribution circuit 135 is disposed between the data driver 130 and the data lines (DL1-DLm).

Referring to FIGS. 1 and 4, the data signal distribution circuit 135 switches the data voltage (Vdata) provided from a plurality of channel lines (CL) connected with the data driver 130, and non-sequentially supplies the switched data voltage (Vdata) to the three data lines (DL1, DL2, DL3) . . . (DLm-2, DLm-1, DLm). However, one embodiment of the present disclosure is not limited to the above. For example, one data signal distribution circuit 135 can supply the data voltage (Vdata) to the two data lines, or can supply the data voltage (Vdata) to the four or more data lines.

Referring to FIG. 4, the data signal distribution circuit 135 includes a first switch (SW1) which supplies the data voltage (Vdata), provided from the channel line (CL), to the k-th data line (DL k; DL1, DL4, . . . ) in response to a first data distribution signal (DDS1), a second switch (SW2) which supplies the data voltage (Vdata), provided from the channel line (CL), to the (k+1)-th data line (DL k+1; DL2, DL5, . . . ) in response to a second data distribution signal (DDS2), and a third switch (SW3) which supplies the data voltage (Vdata), provided from the channel line (CL), to the (k+2)-th data line (DL k+2; DL3, DL6, . . . ) in response to a third data distribution signal (DDS3).

According to one embodiment of the present disclosure, the gate driver 120, the shift register 150, and the data signal distribution circuit 135 are disposed in the non-display area of the display panel 110. Thus, a circuit disposed in the non-display area of the display panel 110 and configured to drive the display panel 100 is referred to as a panel driver.

According to one embodiment of the present disclosure, transistors disposed in the stage 151 of the shift register 150 are thin film transistors, and the first, second, and third switches (SW1, SW2, SW3) of the data signal distribution circuit 135 are also thin film transistors.

The display apparatus 100 according to one embodiment of the present disclosure includes the display area (DA) for displaying an image, and the non-display area (NDA) on which an image is not displayed. The display area (DA) includes a first thin film transistor (T1), and the non-display area (NDA) includes a second thin film transistor (T2).

For example, the first thin film transistor (T1) of the display area (DA) can be the thin film transistors disposed in the pixel (P). The second thin film transistor (T2) of the non-display area (NDA) can be the thin film transistor of the stage 151, and the thin film transistors of the data signal distribution circuit 135.

Figure 5:
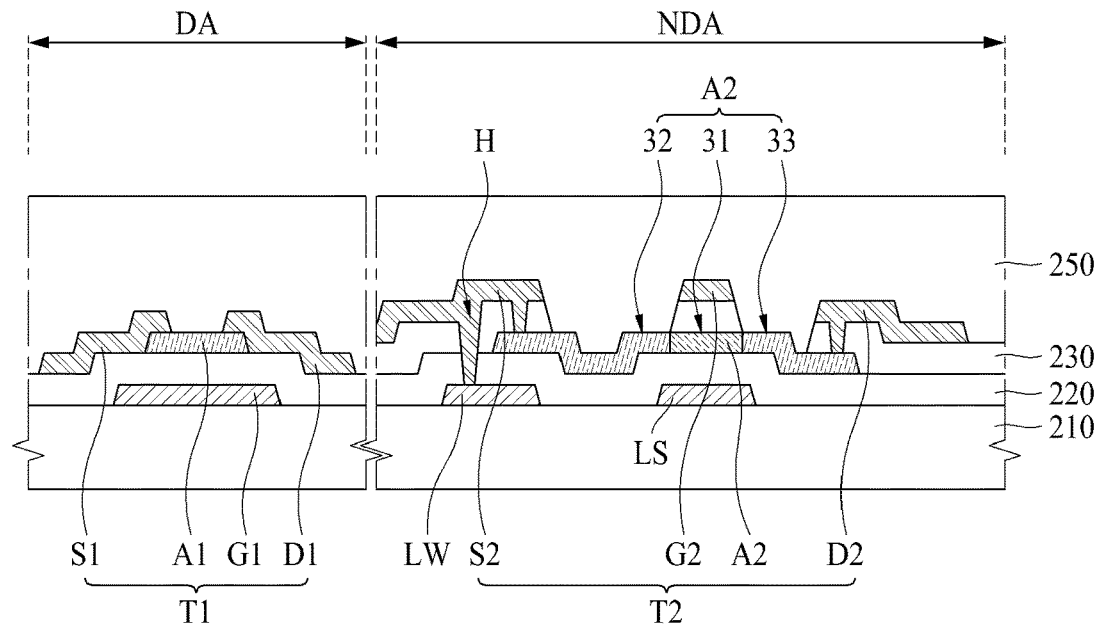
FIG. 5 is a schematic cross sectional view illustrating a first thin film transistor of a display area and a second thin film transistor of a non-display area.

FIG. 5 is a schematic cross sectional view illustrating the first thin film transistor (T1) of the display area (DA), and the second thin film transistor (T2) of the non-display area (NDA).

According to one embodiment of the present disclosure, the first thin film transistor (T1) has a bottom gate structure, and the second thin film transistor (T2) has a top gate structure.

The first thin film transistor (T1) includes a first gate electrode (G1) on a substrate 210, and a first active layer (A1) above the first gate electrode (G1). The first gate electrode (G1) is disposed between the substrate 210 and the first active layer (A1).

The second thin film transistor (T2) includes a second active layer (A2) above the substrate 210, and a second gate electrode (G2) on the second active layer (A2). The second active layer (A2) is disposed between the substrate 210 and the second gate electrode (G2).

The substrate 210 can be formed of glass or plastic. The substrate 210 can be formed of plastic having flexibility, for example, polyimide (PI).

Referring to FIG. 5, the first gate electrode (G1), a light shielding layer (LS), and a lower wiring (LW) are disposed on the substrate 210.

A gate signal is input to the first gate electrode (G1). Also, the first gate electrode (G1) blocks ambient light which is incident on the first active layer (A1).

The light shielding layer (LS) blocks ambient light which is incident on the second active layer (A2).

The lower wiring (LW) is one of the signal lines provided on the substrate 210. The lower wiring (LW) can be connected with any one of second source electrode (S2) and second drain electrodes (D2) of the second thin film transistor (T2) disposed in the non-display area (NDA). For example, the lower wiring (LW) can be the signal line [Vout(SS)] which outputs the gate pulse (GP) (See FIGS. 3 and 17). Also, the lower wiring (LW) can be any one electrode of a capacitor.

The light shielding layer (LS) and the lower wiring (LW) can be formed of the same material as that of the first gate electrode (G1). The first gate electrode (G1), the light shielding layer (LS), and the lower wiring (LW) can be manufactured at the same time by the same process.

The first gate electrode (G1) can include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The first gate electrode (G1) can have a multi-layered structure including at least two layers with the different physical properties.

A first gate insulating film 220 is disposed on the first gate electrode (G1), the light shielding layer (LS), and the lower wiring (LW). The first gate insulating film 220 is formed of an insulating material, and the first gate insulating film 220 insulates the first gate electrode (G1) and the first active layer (A1) from each other. The first gate insulating film 220 can be formed of the insulating material, for example, silicon oxide or silicon nitride.

The first active layer (A1) is disposed on the first gate insulating film 220. At least a portion of the first active layer (A1) overlaps with the first gate electrode (G1). Referring to FIG. 5, the first gate insulating film 220 is disposed between the first active layer (A1) and the first gate electrode (G1).

Also, the second active layer (A2) is disposed on the first gate insulating film 220. At least a portion of the second active layer (A2) overlaps with the light shielding layer (LS).

Referring to FIG. 5, the first active layer (A1) and the second active layer (A2) can be disposed on the same layer. In this case, the first active layer (A1) and the second active layer (A2) can be patterned at the same time by the same process using the same material. However, one embodiment of the present disclosure is not limited to the above. The first active layer (A1) and the second active layer (A2) can be disposed on the different layers, and can be formed of the different materials.

According to one embodiment of the present disclosure, the first active layer (A1) and the second active layer (A2) can include an oxide semiconductor material. For example, the first active layer (A1) and the second active layer (A2) can include at least one among IZO(InZnO)-based oxide semiconductor material, IGO(InGaO)-based oxide semiconductor material, GO(GaO)-based oxide semiconductor material, ITO(InSnO)-based oxide semiconductor material, IGZO(InGaZnO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material r, and ITZO(InSnZnO)-based oxide semiconductor material. However, one embodiment of the present disclosure is not limited to the above materials. The first and second active layers (A1, A2) can be formed of other oxide semiconductor materials generally known to those in the art.

Each of the first active layer (A1) and the second active layer (A2) can have a multi-layered structure.

A first source electrode (S1) and a first drain electrode (D1) are disposed on the first active layer (A1). The first source electrode (S1) and the first drain electrode (D1) are spaced apart from each other, and are respectively connected with the first active layer (A1). Referring to FIG. 5, at least a portion of the first source electrode (S1) and at least a portion of the first drain electrode (D1) are in contact with the first active layer (A1), respectively.

According to one embodiment of the present disclosure, at least one of the first source electrode (S1) and the first drain electrode (D1) can be connected with the data line (DL). At least one of the first source electrode (S1) and the first drain electrode (D1) can extend from the data line (DL).

Referring to FIG. 5, a second gate insulating film 230 is disposed on the second active layer (A2). The second gate insulating film 230 has the insulating properties. Referring to FIG. 5, the second gate insulating film 230 can be patterned.

The second gate electrode (G2), the second source electrode (S2), and the second drain electrode (D2) are disposed on the second gate insulating film 230. The second source electrode (S2) and the second drain electrode (D2) are spaced apart from each other, and are respectively connected with the second active layer (A2).

According to one embodiment of the present disclosure, the second source electrode (S2) and the second drain electrode (D2) are disposed on the same layer as that of the second gate electrode (G2).

Figure 17:
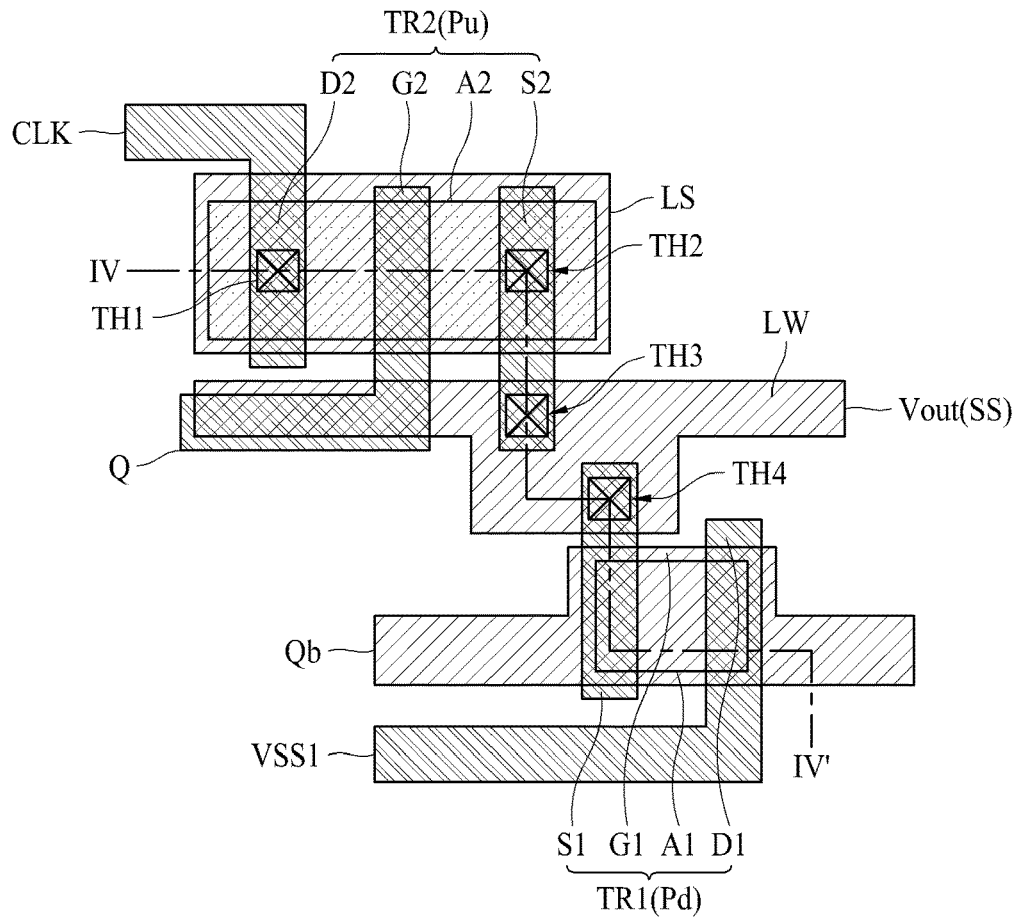
FIG. 17 is a plan view illustrating a pull-up transistor (Pu) and a pull-down transistor (Pd) shown in FIG. 3.

According to one embodiment of the present disclosure, any one of the second source electrode (S2) and the second drain electrode (D2) is in contact with the lower wiring (LW) which is disposed on the same layer as that of the first gate electrode (G1). Referring to FIG. 5, the second source electrode (S2) is in contact with the lower wiring (LW). Referring to FIGS. 3 and 17, the signal line for outputting [Vout(SS)] the gate pulse (GP) can be the lower wiring (LW). Referring to FIG. 5, the second source electrode (S2) is in contact with the lower wiring (LW) through a contact hole (H) formed in the first gate insulating film 220 and the second gate insulating film 230.

Also, the other of the second source electrode (S2) and the second drain electrode (D2) can be in contact with an upper wiring (not shown) which is disposed on the same layer as that of the second gate electrode. Referring to FIG. 5, the second drain electrode (D2) is in contact with the upper wiring (UW). For example, the signal line for outputting the gate clock (CLK) signal can be the upper wiring (UW) (See FIGS. 3 and 17).

However, one embodiment of the present disclosure is not limited to the above. The second source electrode (S2) and the second drain electrode (D2) can be used interchangeably. For example, the second source electrode (S2) can be in contact with the upper wiring (UW), and the second drain electrode (D2) can be in contact with the lower wiring (LW).

According to one embodiment of the present disclosure, the second gate insulating film 230 is disposed between the second active layer (A2) and the second gate electrode (G2), between the second active layer (A2) and the second source electrode (S2), and between the second active layer (A2) and the second drain electrode (D2).

Referring to FIG. 5, the second gate insulating film 230 is not disposed on the second active layer (A2) between the second source electrode (S2) and the second gate electrode (G2), and between the second drain electrode (D2) and the second gate electrode (G2). In brief, it can be described that the second gate insulating film 230 is not disposed in the area between the second source electrode (S2) and the second gate electrode (G2), and between the second drain electrode (D2) and the second gate electrode (G2). In order to improve the efficiency of a process of selectively providing conductivity to the second active layer (A2), the second gate insulating film 230 can be removed from the area positioned between the second source electrode (S2) and the second gate electrode (G2), and the area positioned between the second drain electrode (D2) and the second gate electrode (G2).

According to one embodiment of the present disclosure, the first source electrode (S1), the first drain electrode (D1), the second gate electrode (G2), the second source electrode (S2), and the second drain electrode (D2) can be manufactured at the same time by the same process using the same material.

The first source electrode (S1), the first drain electrode (D1), the second gate electrode (G2), the second source electrode (S2), and the second drain electrode (D2) can include at least one among aluminum (Al), argentums (Ag), copper (Cu), molybdenum (Mo), chrome (Cr), tantalum (Ta), neodymium (Nd), and titanium (Ti). The first source electrode (S1), the first drain electrode (D1), the second gate electrode (G2), the second source electrode (S2), and the second drain electrode (D2) can be formed in a single-layered structure or a multi-layered structure.

According to one embodiment of the present disclosure, the second active layer (A2) can have a conducting region by a selective conductivity providing process using the second gate electrode (G2) as a mask. The conducting region is a portion of the active layer provided with conductivity.

A region of the second active layer (A2), which overlaps with the second gate electrode (G2), are not provided with conductivity, and thus does not become the conducting regions, but become a channel region 31. Some regions of the second active layer (A2), which do not overlap with the second gate electrode (G2), are provided with conductivity, and thus become the conducting regions 32 and 33. Generally, the conducting regions 32 and 33 can be formed at both sides with respect to the channel region 31.

According to one embodiment of the present disclosure, a region of the second active layer (A2) can be selectively provided with conductivity by a plasma treatment or a dry etching process. For the plasma treatment or the dry etching process, the second gate insulating film 230 can be removed from the area positioned between the second source electrode (S2) and the second gate electrode (G2), and between the second drain electrode (D2) and the second gate electrode (G2).

Also, a region of the second active layer (A2) can be selectively provided with conductivity by a doping process using dopant. In this case, a doped region is selectively provided with conductivity, and thus become the conducting region. For the doping process, for example, at least one of boron (B) ion, phosphorous (P) ion, and fluorine (F) ion can be used.

However, one embodiment of the present disclosure is not limited to the above. Herein, a region of the second active layer (A2) can be selectively provided with conductivity by a light irradiation process.

Any one of the conducting regions 32 and 33 becomes a source region 32, and the other becomes a drain region 33. The source region 32 serves as a source connection region connected with the source electrode (S2). The drain region 33 serves as a drain connection region connected with the drain electrode (D2).

The source region 32 and the drain region 33 shown in the drawings are distinguished from each other, for convenience of explanation. However, the source region 32 and the drain region 33 can be used interchangeably. According to a voltage, the source region 32 can become the drain region 33, and the drain region 33 can become the source region 32. Also, if needed, the source region 32 can become the source electrode (S2) and the drain electrode (D2), and the drain region 33 can become the drain electrode (D2) and the source electrode (S2).

A protection layer 250 is disposed on the first source electrode (S1), the first drain electrode (D1), the second gate electrode (G2), the second source electrode (S2), and the second drain electrode (D2). The protection layer 250 is provided to protect the first thin film transistor (T1) and the second thin film transistor (T2), and to planarize upper surfaces of the first and second thin film transistors (T1, T2).

The first thin film transistor (T1) includes the first active layer (A1), the first gate electrode (G1), the first source electrode (S1), and the first drain electrode (D1).

The first thin film transistor (T1) having the bottom gate structure occupies a small sized area, whereby it is favorable to a high integration of the thin film transistor. Thus, according to one embodiment of the present disclosure, the first thin film transistor (T1) is disposed in the display area (DA) so that it is possible to manufacture the high-resolution display apparatus 100.

The second thin film transistor (T2) includes the second active layer (A2), the second gate electrode (G2), the second source electrode (S2), and the second drain electrode (D2).

In the display apparatus 100, most power is consumed in the non-display area (NDA) having the panel driver. However, in case of the first thin film transistor (T1) having the bottom gate structure, a cap is generated between the gate electrode and the source electrode, or between the gate electrode and the drain electrode, whereby it causes a large power consumption. Meanwhile, in case of the second thin film transistor (T2) having the top gate structure, a cap is not generated, to thereby enable a small power consumption. Thus, according to one embodiment of the present disclosure, the second thin film transistor (T2) having the top gate structure is disposed in the non-display area (NDA) which generates a large power consumption so that it is possible to reduce a power consumption.

Figure 6:
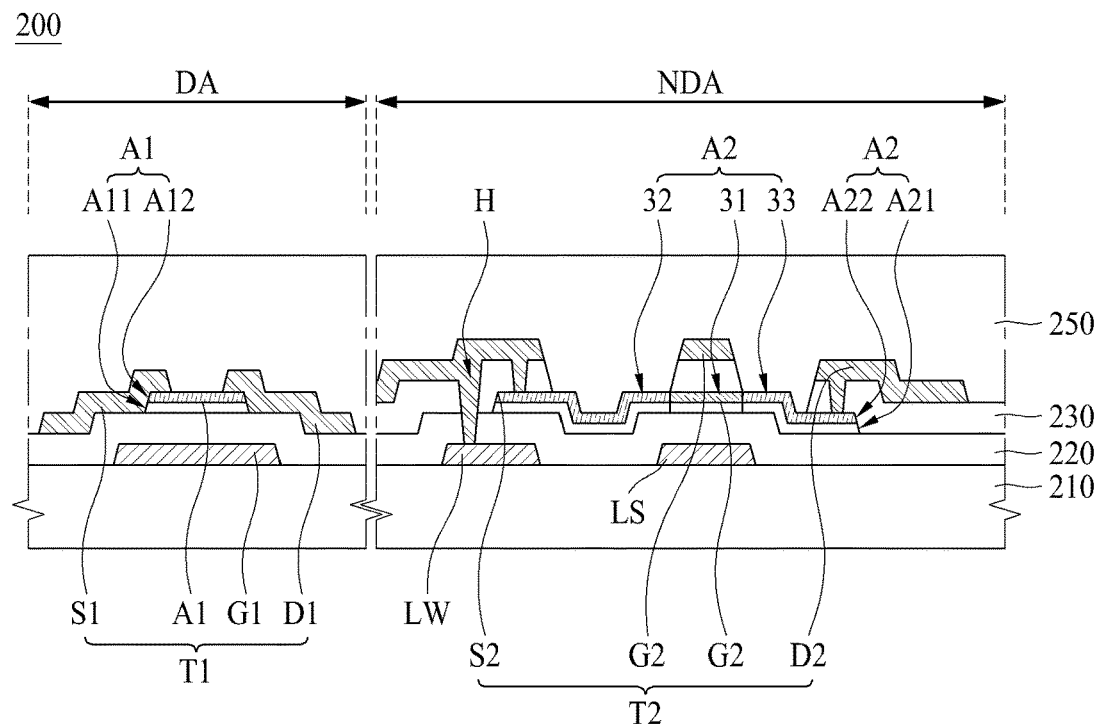
FIG. 6 is a schematic cross sectional view illustrating a first thin film transistor and a second thin film transistor in a display apparatus according to another embodiment of the present disclosure.

FIG. 6 is a schematic cross sectional view illustrating a first thin film transistor (T1) and a second thin film transistor (T2) in a display apparatus 200 according to another embodiment of the present disclosure.

According to another embodiment of the present disclosure, at least one of a first active layer (A1) and a second active layer (A2) includes a first oxide semiconductor layer (A11, A21), and a second oxide semiconductor layer (A12, A22) on the first oxide semiconductor layer (A11, A21).

Referring to FIG. 6, the first active layer (A1) can have a multi-layered structure. The first active layer (A1) can include the first oxide semiconductor layer (A11), and the second oxide semiconductor layer (A12) on the first oxide semiconductor layer (A11).

Also, the second active layer (A1) can have a multi-layered structure. The second active layer (A2) can include the first oxide semiconductor layer (A21), and the second oxide semiconductor layer (A22) on the first oxide semiconductor layer (A21).

According to another embodiment of the present disclosure, the first oxide semiconductor layer (A11, A21) functions as a channel layer, and the second oxide semiconductor layer (A12, A22) functions as a protection layer for protecting the first oxide semiconductor layer (A11, A21), in addition to the channel layer. According to another embodiment of the present disclosure, any one of the first oxide semiconductor layer (A11, A21) and the second oxide semiconductor layer (A12, A22) can function as a main channel layer.

The first oxide semiconductor layer (A11, A21) can include at least one among IZO(InZnO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and ITZO(InSnZnO)-based oxide semiconductor material. However, one embodiment of the present disclosure is not limited to the above materials. The first oxide semiconductor layer (A11, A21) can be formed of other oxide semiconductor materials generally known to those in the art.

The second oxide semiconductor layer (A12, A22) can have a good film stability. According to one embodiment of the present disclosure, the second oxide semiconductor layer (A12, A22) can include at least one among IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GO(GaO)-based oxide semiconductor material, and GZO(GaZnO)-based oxide semiconductor material. However, one embodiment of the present disclosure is not limited to the above materials. The second oxide semiconductor layer (A12, A22) can be formed of other oxide semiconductor materials generally known to those in the art.

By adjusting an etching ratio of the first oxide semiconductor layer (A11, A21) and the second oxide semiconductor layer (A12, A22), each of the first active layer (A1) and the second active layer (A2) can have a tapered shape.

Figure 7:
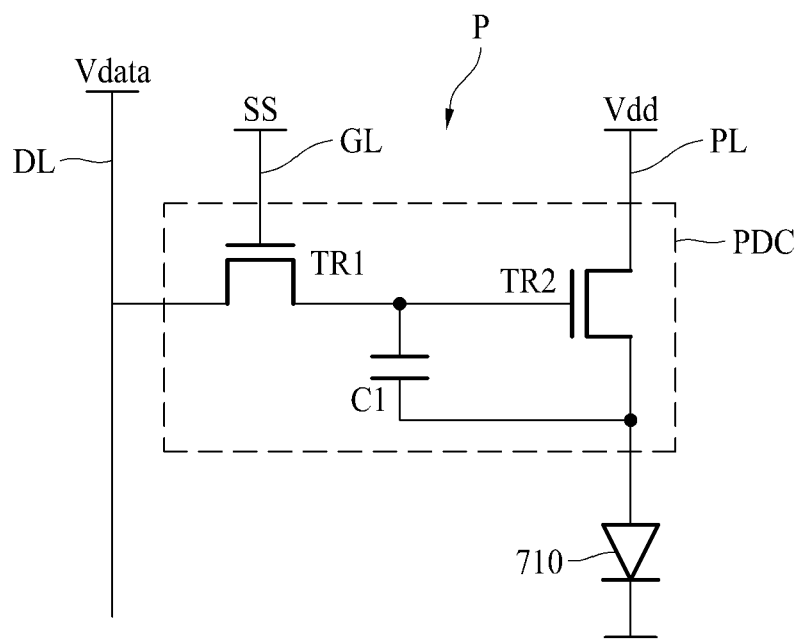
FIG. 7 is a circuit diagram for any one pixel of FIG. 1.
Figure 8:
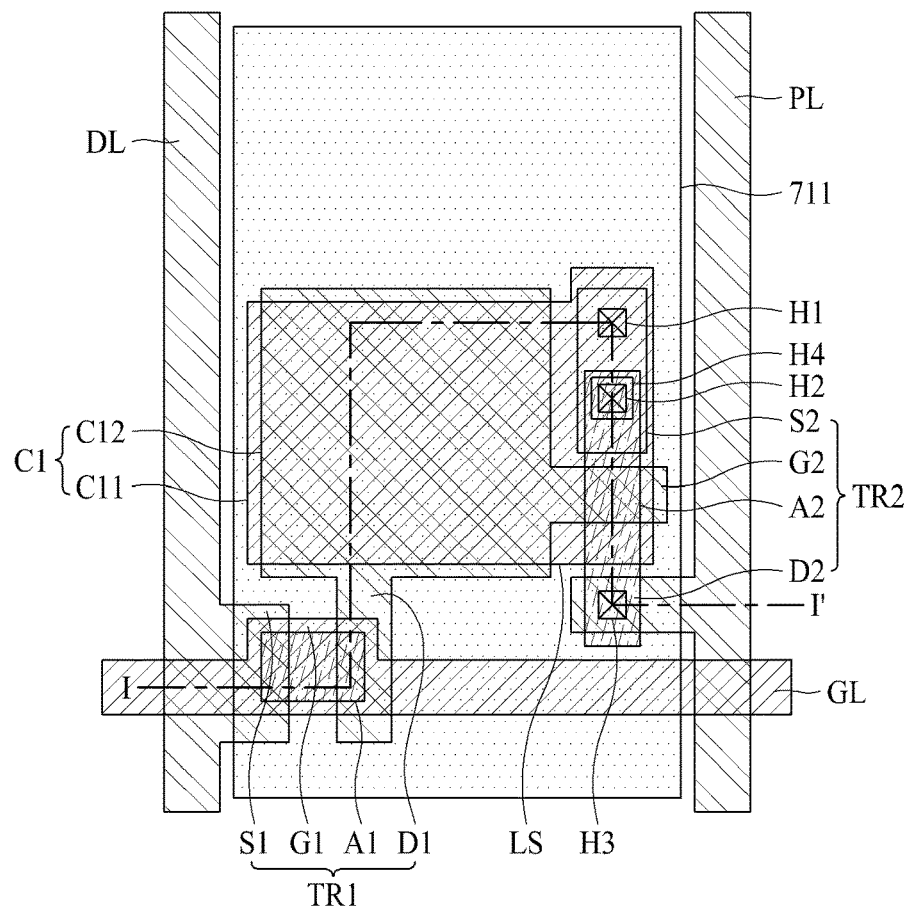
FIG. 8 is a plan view for the pixel of FIG. 7.
Figure 9:
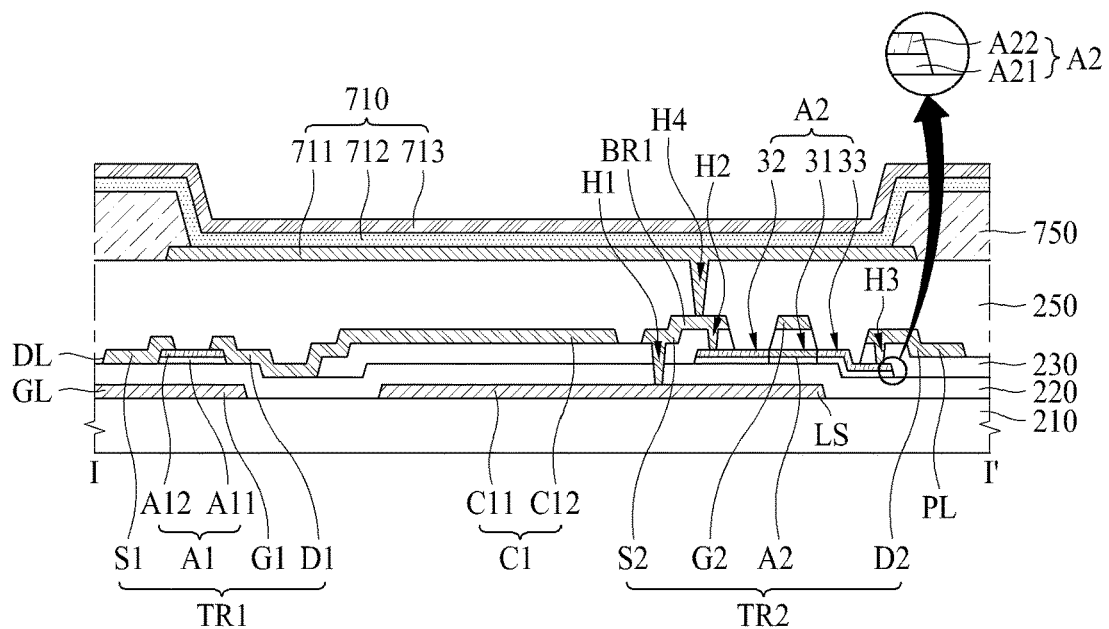
FIG. 9 is a cross sectional view along line I-I' of FIG. 8.

FIG. 7 is a circuit diagram for any one pixel (P) of FIG. 1, FIG. 8 is a plan view for the pixel (P) of FIG. 7, and FIG. 9 is a cross sectional view along line I-I' of FIG. 8.

Referring to FIGS. 7, 8, and 9, the display apparatus 100 according to one embodiment of the present disclosure includes the substrate 210, the pixel driver (PDC) on the substrate 210, and the display device 710 connected with the pixel driver (PDC).

The circuit diagram of FIG. 7 corresponds to an equivalent circuit diagram for one pixel (P) in the display apparatus 100 comprising an organic light emitting diode (OLED) functioning as the emission device 710. Accordingly, the display apparatus 100 according to one embodiment of the present disclosure is an organic light emitting diode (OLED) display apparatus.

The pixel driver (PDC) of FIG. 7 includes the first thin film transistor (TR1) corresponding to a switching transistor, and the second thin film transistor (TR2) corresponding to a driving transistor.

The first thin film transistor (TR1) shown in FIGS. 7, 8, and 9 has the bottom gate structure, and the first thin film transistor (TR1) shown in FIGS. 7, 8, and 9 corresponds to the thin film transistor of the display area (DA), which corresponds to the first thin film transistor (T1) shown in FIGS. 5 and 6.

Referring to FIG. 7, the first thin film transistor (TR1) is connected with the gate line (GL) and the data line (DL), and the first thin film transistor (TR1) is turned-on or turned-off by the scan signal (SS) supplied through the gate line (GL).

The data line (DL) provides the data voltage (Vdata) to the pixel driver (PDC), and the first thin film transistor (TR1) controls applying the data voltage (Vdata).

A driving power line (PL) provides a driving voltage (Vdd) to the display device 710, and the second thin film transistor (TR2) controls the driving voltage (Vdd). Herein, the driving voltage (Vdd) is a pixel driving voltage for driving the organic light emitting diode (OLED) corresponding to the display device 710.

When the first thin film transistor (TR1) is turned-on, the data voltage (Vdata), which is supplied through the data line (DL), is supplied to the gate electrode (G2) of the second thin film transistor (TR2) connected with the display device 710. The data voltage (Vdata) is charged in a first capacitor (C1) provided between the source electrode (S2) and the gate electrode (G2) of the second thin film transistor (TR2). The first capacitor (C1) corresponds to a storage capacitor (Cst).

An amount of current supplied to the organic light emitting diode (OLED) corresponding to the display device 710 through the second thin film transistor (TR2) is controlled in accordance with the data voltage (Vdd), whereby it is possible to control a grayscale of light emitted from the display device 710.

Referring to FIGS. 8 and 9, the first thin film transistor (TR1) includes the first gate electrode (G1) on the substrate 210, and the first active layer (A1) above the first gate electrode (G1). The first active layer (A1) is spaced apart from the first gate electrode (G1), and overlaps with at least a portion of the first gate electrode (G1).

The second thin film transistor (TR2) includes the second active layer (A2) above the substrate 210, and the second gate electrode (G2) on the second active layer (A2). The second gate electrode (G2) is spaced apart from the second active layer (A2), and overlaps with at least a portion of the second active layer (A2).

The substrate 210 can be formed of glass or plastic. The substrate 210 can be formed of plastic having flexibility, for example, polyimide (PI).

Referring to FIGS. 8 and 9, the gate line (GL), the first gate electrode (G1), and the light shielding layer (LS) are disposed on the substrate 210. Referring to FIGS. 8 and 9, the first gate electrode (G1) extends from the gate line (GL), and the first gate electrode (G1) blocks ambient light which is incident on the first active layer (A1). The light shielding layer (LS) blocks ambient light which is incident on the second active layer (A2). The light shielding layer (LS) can be formed of the same material as that of the first gate electrode (G1). The first gate electrode (G1) and the light shielding layer (LS) can be manufactured at the same time by the same process.

According to one embodiment of the present disclosure, a portion of the light shielding layer (LS) functions as a first capacitor electrode (C11) of a first capacitor (C1).

The first gate insulating film 220 is disposed on the gate line (GL), the first gate electrode (G1), the light shielding layer (LS), and the first capacitor electrode (C11). The first gate insulating film 220 has the insulating properties, and the first gate insulating film 220 insulates the first gate electrode (G1) and the first active layer (A1) from each other. The first gate insulating film 220 can be formed of an insulating material, for example, silicon oxide or silicon nitride.

The first active layer (A1) and the second active layer (A2) are disposed on the first gate insulating film 220.

Referring to FIG. 9, the first active layer (A1) and the second active layer (A2) are disposed on the same layer. In this case, the first active layer (A1) and the second active layer (A2) can be patterned at the same time by the same process using the same material. However, one embodiment of the present disclosure is not limited to the above. The first active layer (A1) and the second active layer (A2) can be disposed in the different layers, and can be formed of the different materials.

According to one embodiment of the present disclosure, the first active layer (A1) and the second active layer (A2) can include an oxide semiconductor material.

Referring to FIG. 9, the first active layer (A1) can have a multi-layered structure. The first active layer (A1) can include the first oxide semiconductor layer (A11), and the second oxide semiconductor layer (A12) on the first oxide semiconductor layer (A11).

Also, the second active layer (A2) can have a multi-layered structure. The second active layer (A2) can include the first oxide semiconductor layer (A21), and the second oxide semiconductor layer (A22) on the first oxide semiconductor layer (A21).

The first source electrode (S1) and the first drain electrode (D1) are disposed on the at least some portions of the first active layer (A1), respectively. The first source electrode (S1) and the first drain electrode (D1) are spaced apart from each other, and are respectively connected with the first active layer (A1).

According to one embodiment of the present disclosure, at least one of the first source electrode (S1) and the first drain electrode (D1) can be connected with the data line (DL). Referring to FIG. 8, the first source electrode (S1) extends from the data line (DL), and the first source electrode (S1) is formed as one body with the data line (DL).

Referring to FIG. 9, the second gate insulating film 230 is disposed on the second active layer (A2). The second gate insulating film 230 has the insulating properties. Referring to FIG. 9, the second gate insulating film 230 can be patterned.

The second gate electrode (G2), the second source electrode (S2), and the second drain electrode (D2) are disposed on the second gate insulating film 230. The second source electrode (S2) and the second drain electrode (D2) are spaced apart from each other, and are respectively connected with the second active layer (A2).

According to one embodiment of the present disclosure, the second source electrode (S2) and the second drain electrode (D2) are disposed on the same layer as that of the second gate electrode (G2).

According to one embodiment of the present disclosure, the second gate insulating film 230 is disposed in the area between the second active layer (A2) and the second gate electrode (G2), between the second active layer (A2) and the second source electrode (S2), and between the second active layer (A2) and the second drain electrode (D2).

Referring to FIG. 9, the second gate insulating film 230 is not disposed on the second active layer (A2) between the second source electrode (S2) and the second gate electrode (G2), and between the second drain electrode (D2) and the second gate electrode (G2).

According to one embodiment of the present disclosure, any one of the second source electrode (S2) and the second drain electrode (D2) is in contact with the first capacitor electrode (C11) which is disposed on the same layer as that of the first gate electrode (G1). In FIG. 9, the second source electrode (S2) is in contact with the first capacitor electrode (C11). In detail, the second source electrode (S2) is in contact with the first capacitor electrode (C11) through a first contact hole (H1) formed in the first gate insulating film 220 and the second gate insulating film 230. The second source electrode (S2) is connected with the source region 32 of the second active layer (A2) through a second contact hole (H2) formed in the second gate insulating film 230.

The second drain electrode (D2) is connected with the drain region 33 of the second active layer (A2) through a third contact hole (H3) formed in the second gate insulating film 230. Also, the second drain electrode (D2) is in contact with the driving power line (PL) corresponding to the upper wiring (UW). Referring to FIG. 9, the second drain electrode (D2) is formed as one body with the driving power line (PL), whereby the second drain electrode (D2) can be the region extending from the driving power line (PL).

However, one embodiment of the present disclosure is not limited to the above. The second source electrode (S2) and the second drain electrode (D2) can be used interchangeably.

Referring to FIGS. 8 and 9, the first drain electrode (D1) extends onto the second gate insulating film 230, whereby it can be a second capacitor electrode (C12). The second capacitor electrode (C12) can be disposed on the same layer as those of the second source electrode (S2) and the second drain electrode (D2), and can be formed of the same material as those of the second source electrode (S2) and the second drain electrode (D2). According to one embodiment of the present disclosure, a portion of the first drain electrode (D1) can be the second capacitor electrode (C12). The first capacitor electrode (C11) and the second capacitor electrode (C12) overlap with each other, to thereby form the first capacitor (C1).

According to one embodiment of the present disclosure, the first source electrode (S1), the first drain electrode (D1), the second gate electrode (G2), the second source electrode (S2), the second drain electrode (D2), the data line (DL), the driving power line (PL), and the second capacitor electrode (C12) can be manufactured at the same time by the same process using the same material.

According to one embodiment of the present disclosure, the second active layer (A2) can have a conducting region by a selective conductivity providing process using the second gate electrode (G2) as a mask.

A region of the second active layer (A2), which overlaps with the second gate electrode (G2), is not provided with conductivity, and thus does not become a conducting region, but become the channel region 31. Some regions of the second active layer (A2), which do not overlapped with the second gate electrode (G2), are selectively provided with conductivity, and thus become the conducting regions 32 and 33. Generally, the conducting regions 32 and 33 are formed at both sides with respect to the channel region 31.

Any one of the conducting regions 32 and 33 becomes the source region 32, and the other becomes the drain region 33. The source region 32 serves as a source connection region connected with the source electrode (S2), or the source region 32 itself serves as the source electrode (S2). The drain region 33 serves as a drain connection region connected with the drain electrode (D2), or the drain region 33 itself serves as the drain electrode (D2).

The source region 32 and the drain region 33 shown in the drawings are distinguished from each other, for convenience of explanation. However, the source region 32 and the drain region 33 can be used interchangeably.

According to the above structure, the first thin film transistor (TR1) and the second thin film transistor (TR2) are provided in the display area (DA).

The protection layer 250 is disposed on the first thin film transistor (TR1) and the second thin film transistor (TR2). The protection layer 250 is provided to planarize upper surfaces of the first and second thin film transistors (TR1, TR2), and to protect the pixel driver (PDC). The protection layer 250 is referred to as a planarization layer.

The display device 710 is disposed on the protection layer 250. In detail, a first electrode 711, an emission layer 712, and a second electrode 713 are sequentially disposed on the protection layer 250, to thereby form the display device 710. The display device 710 is connected with the pixel driver (PDC).

The first electrode 711 of the display device 710 is disposed on the protection layer 250. The first electrode 711 can be connected with the second thin film transistor (TR2) through a fourth contact hole (H4). The fourth contact hole (H4) can be formed in the protection layer 250.

Referring to FIG. 9, the first electrode 711 is connected with the second source electrode (S2) of the second thin film transistor (TR2) through the fourth contact hole (H4). As a result, the first electrode 711 can be electrically connected with the first capacitor electrode (C11).

A bank layer 750 is disposed in the periphery of the first electrode 711. The bank layer 750 defines an emission area of the display device 710.

The emission layer 712 is disposed on the first electrode 711. Herein, the emission layer 712 is an organic emission layer including an organic material. The second electrode 713 is disposed on the emission layer 712. Accordingly, it is possible to complete the display device 710.

The display device 710 shown in FIG. 9 is an organic light emitting diode (OLED). Thus, the display apparatus 100 according to one embodiment of the present disclosure corresponds to an organic light emitting display apparatus.

According to one embodiment of the present disclosure, the first thin film transistor (TR1) has the bottom gate structure, and the first thin film transistor (TR1) having the bottom gate structure occupies a relatively small size in comparison to that of the thin film transistor having the top gate structure. According as the first thin film transistor (TR1) having the bottom gate structure with the relatively small size is disposed in the display area (DA), it is possible to manufacture the high resolution display apparatus 100.

Figure 10:
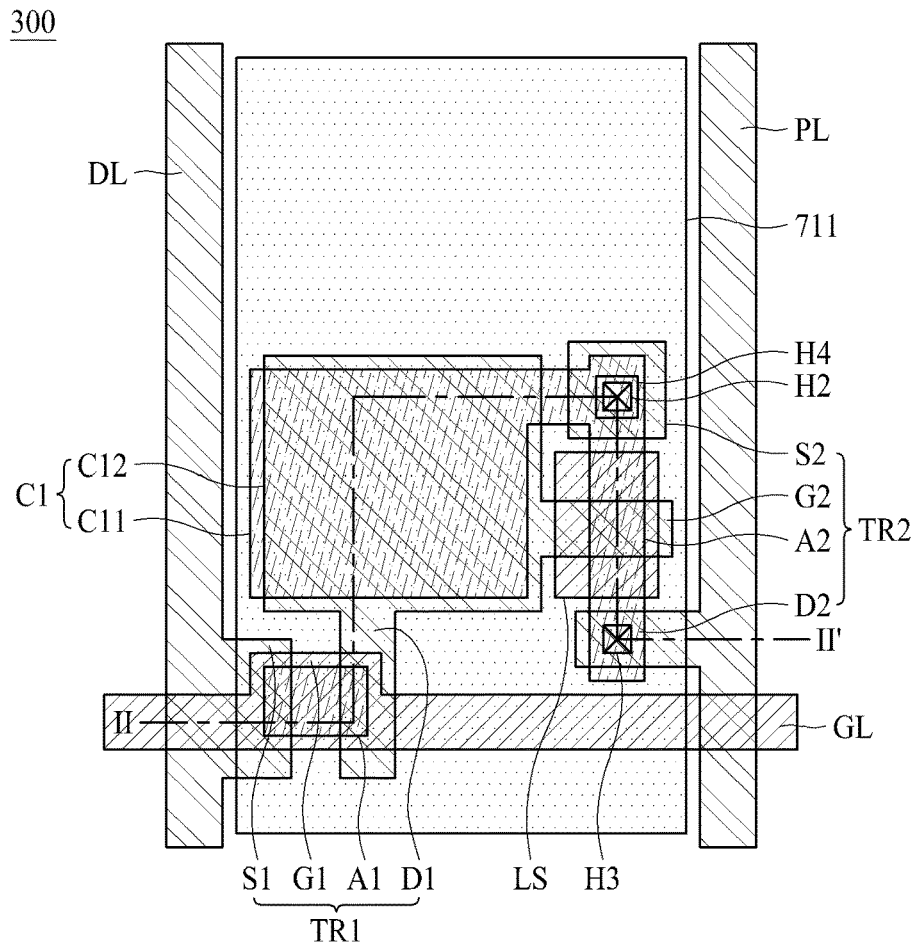
FIG. 10 is a plan view illustrating any one pixel of a display apparatus according to another embodiment of the present disclosure.
Figure 11:
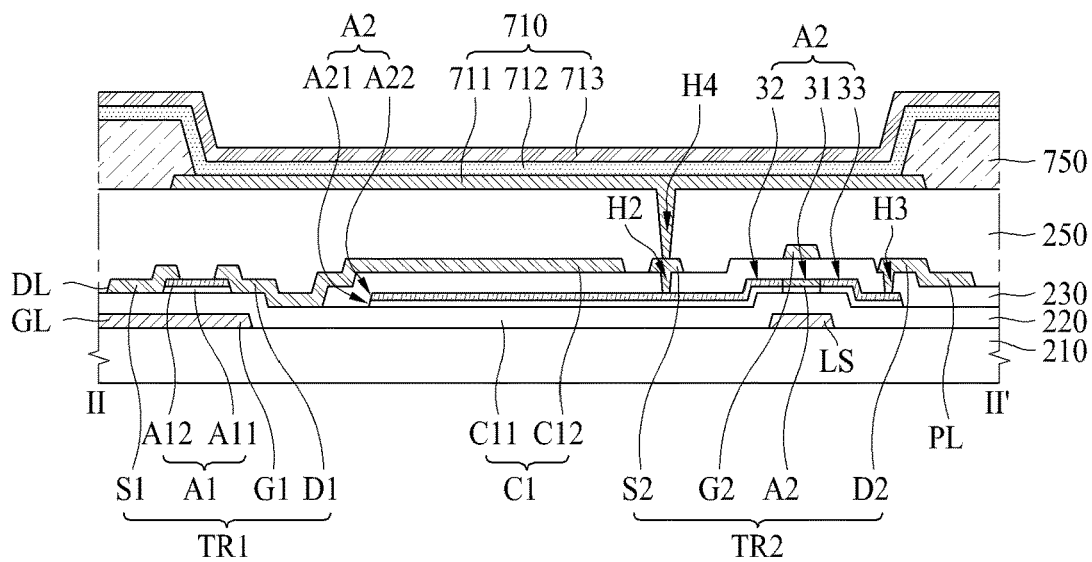
FIG. 11 is a cross sectional view along line II-IP of FIG. 10.

FIG. 10 is a plan view illustrating a pixel of a display apparatus 300 according to another embodiment of the present disclosure. FIG. 11 is a cross sectional view along line II-IF of FIG. 10.

Referring to FIGS. 10 and 11, a source region 32 of a second active layer (A2) extends onto a first gate insulating film 220, to thereby form a first capacitor electrode (C11). In detail, a portion of the source region 32 of the second active layer (A2) functions as the first capacitor electrode (C11). In this case, a first capacitor (C1) can be formed by the first capacitor electrode (C11) which is made by the extending portion from the source region 32 of the second active layer (A2), and a second capacitor electrode (C12) which is made by an extending portion from a first drain electrode (D1).

Referring to FIGS. 10 and 11, a second source electrode (S2) is connected with the source region 32 of the second active layer (A2) through a second contact hole (H2) formed in a second gate insulating film 230. The second drain electrode (D2) is connected with a drain region 33 of the second active layer (A2) through a third contact hole (H3) formed in the second gate insulating film 230.

Figure 12:
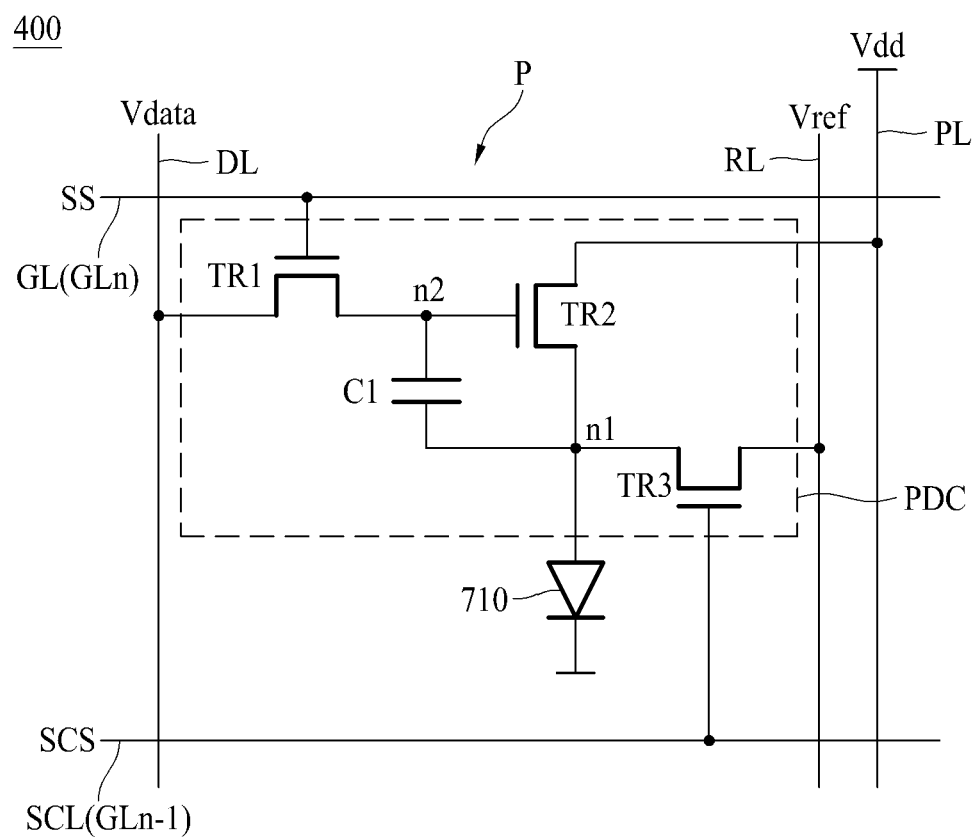
FIG. 12 is a circuit diagram for any one pixel of a display apparatus according to another embodiment of the present disclosure.

FIG. 12 is a circuit diagram for any one pixel (P) of a display apparatus 400 according to another embodiment of the present disclosure. FIG. 12 is an equivalent circuit diagram for a pixel (P) of an organic light emitting display apparatus.

The pixel (P) of the display apparatus 400 shown in FIG. 12 includes an organic light emitting diode (OLED) corresponding to a display device 710, and a pixel driver (PDC) for driving the display device 710. The display device 710 is connected with the pixel driver (PDC).

In the pixel (P), there are signal lines (DL, GL, PL, RL, SCL) configured to supply signals to the pixel driver (PDC).

A data voltage (Vdata) is supplied to a data line (DL), a scan signal (SS) is supplied to a gate line (GL), a driving voltage (Vdd) for driving the pixel is supplied to a driving power line (PL), a reference voltage (Vref) is supplied to a reference line (RL), and a sensing control signal (SCS) is supplied to a sensing control line (SCL).

Referring to FIG. 12, when the gate line of the $(n)^{th}$ pixel (P) is referred to as "$GL_n$", the gate line of the neighboring $(n-1)^{th}$ pixel (P) is "$GL_{n-1}$", and "$GL_{n-1}$" corresponding to the gate line of the $(n-1)^{th}$ pixel (P) serves as the sensing control line (SCL) of the $(n)^{th}$ pixel (P).

For example, as shown in FIG. 12, the pixel driver (PDC) includes a first thin film transistor (TR1, switching transistor) connected with the gate line (GL) and the data line (DL), a second thin film transistor (TR2, driving transistor) configured to control a level of current which is provided to the display device 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display device 710 and a gate electrode (G2) of the second thin film transistor (TR2). The first capacitor (C1) is referred to as a storage capacitor (Cst).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) provided between the display device 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, a current is supplied to the display device 710 through the second thin film transistor (TR2) by the driving voltage (Vdd) for driving the pixel, whereby light is emitted from the display device 710.

Figure 13:
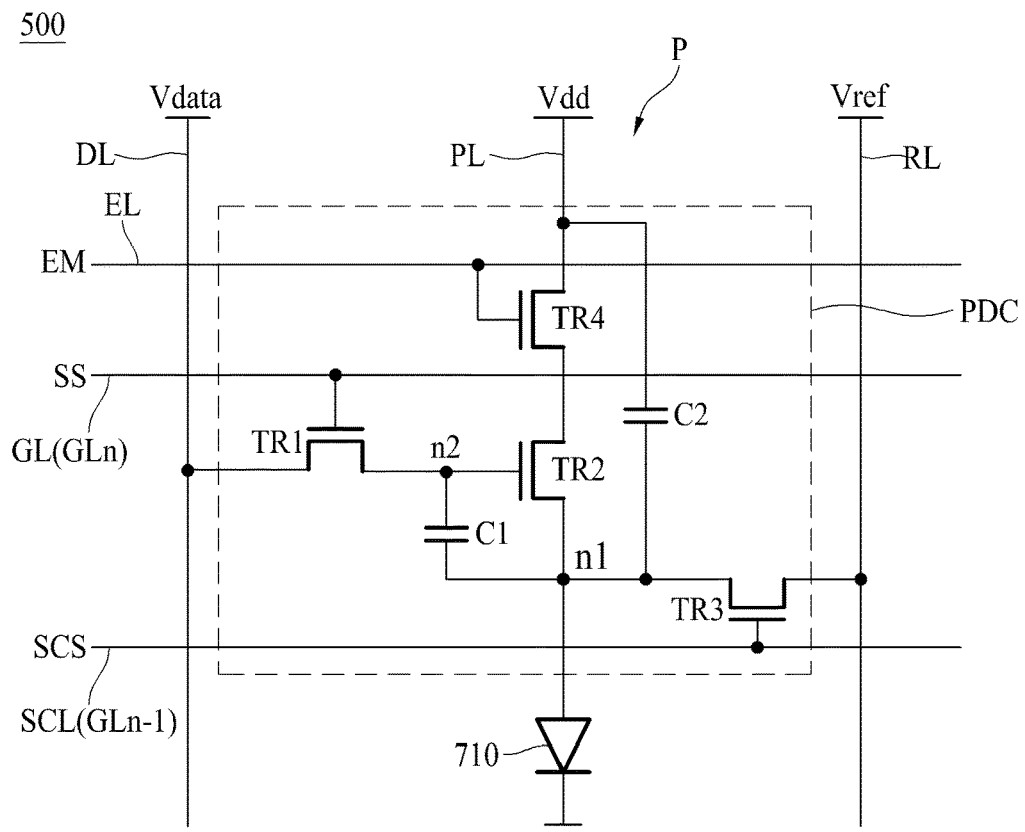
FIG. 13 is a circuit diagram for any one pixel of a display apparatus according to another embodiment of the present disclosure.

FIG. 13 is a circuit diagram illustrating any one pixel (P) of a display apparatus 500 according to another embodiment of the present disclosure.

The pixel (P) of the display apparatus 500 shown in FIG. 13 includes an organic light emitting diode (OLED) corresponding to a display device 710, and a pixel driver (PDC) configured to drive the display device 710. The display device 710 is connected with the pixel driver (PDC).

The pixel driver (PDC) includes thin film transistors (TR1, TR2, TR3, TR4).

In the pixel (P), there are signal lines (DL, EL, GL, PL, SCL, RL) configured to supply driving signals to the pixel driver (PDC).

In comparison to the pixel (P) of FIG. 12, the pixel (P) of FIG. 13 further includes an emission control line (EL). An emission control signal (EM) is supplied to the emission control line (EL).

Also, in comparison to the pixel driver (PDC) of FIG. 12, the pixel driver (PDC) of FIG. 13 further includes a fourth thin film transistor (TR4) corresponding to an emission control transistor configured to control a light emission time point of the second thin film transistor (TR2).

Referring to FIG. 13, when the gate line of the $(n)^{th}$ pixel (P) is referred to as "$GL_n$", the gate line of the neighboring $(n-1)^{th}$ pixel (P) is "$GL_{n-1}$", and "$GL_{n-1}$" corresponding to the gate line of the $(n-1)^{th}$ pixel (P) serves as the sensing control line (SCL) of the $(n)^{th}$ pixel (P).

A first capacitor (C1) is positioned between the display device 710 and a gate electrode (G2) of the second thin film transistor (TR2). Also, a second capacitor (C2) is positioned between one electrode of the display device 710 and a terminal supplied with a driving voltage (Vdd) among terminals of the fourth thin film transistor (TR4).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with a reference line (RL). The third thin film transistor (TR3) is turned-on or turned-off by the sensing control signal (SCS), and the third thin film transistor (TR3) senses the properties of the second thin film transistor (TR2) corresponding the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned-on, a current is supplied to the second thin film transistor (TR2), whereby light is emitted from the display device 710.

The pixel driver (PDC) according to another embodiment of the present disclosure can be formed in various structures in addition to the above-described structure. For example, the pixel driver (PDC) can include five thin film transistors or more.

Figure 14:
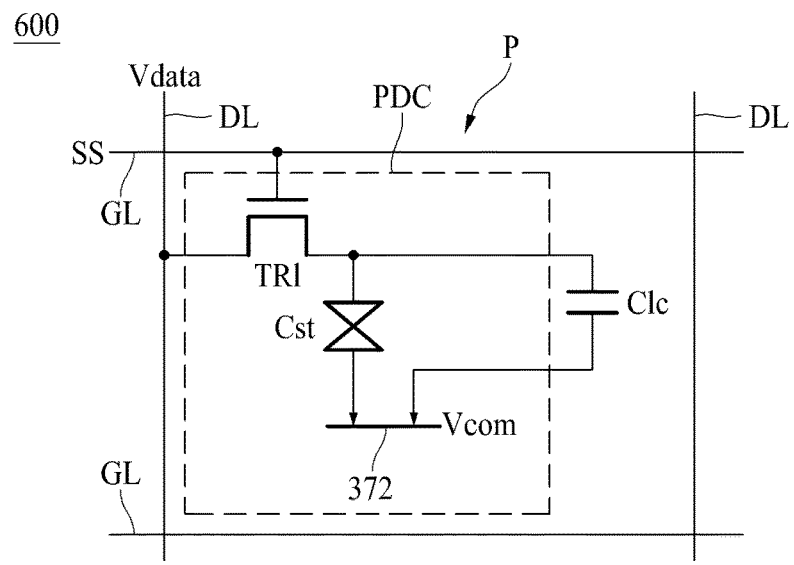
FIG. 14 is a circuit diagram for any one pixel of a display apparatus according to another embodiment of the present disclosure.
Figure 15:
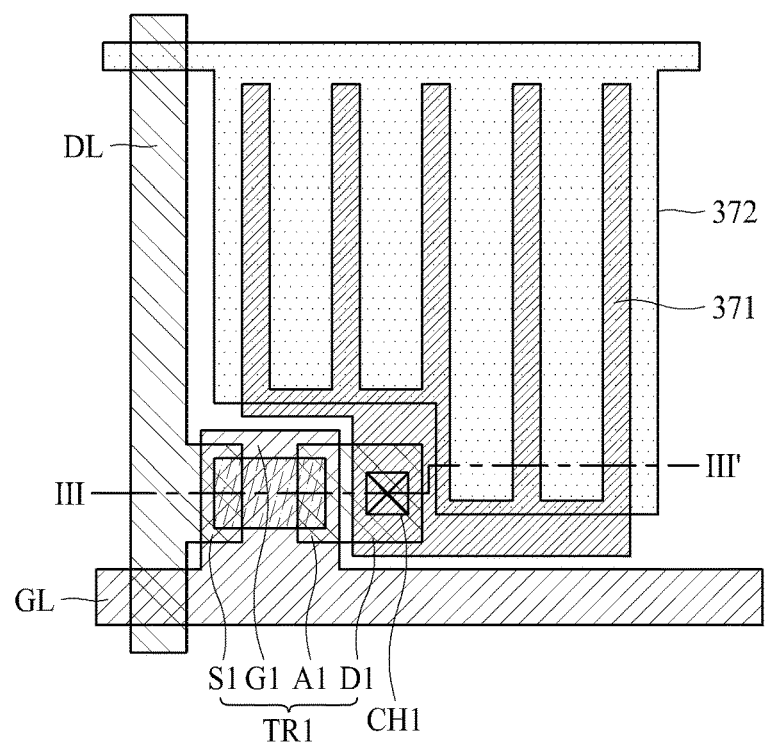
FIG. 15 is a plan view illustrating the pixel (P) of FIG. 14.
Figure 16:
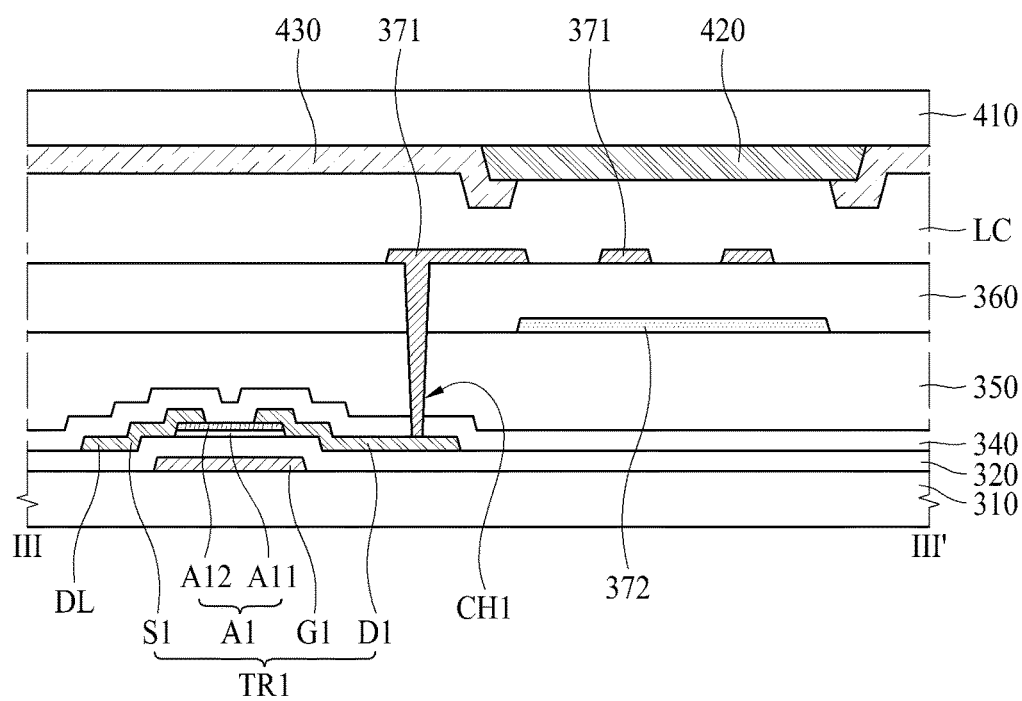
FIG. 16 is a cross sectional view along line of FIG. 15.

FIG. 14 is a circuit diagram for any one pixel (P) of a display apparatus 600 according to another embodiment of the present disclosure. FIG. 15 is a plan view illustrating the pixel (P) of FIG. 14. FIG. 16 is a cross sectional view along line of FIG. 15.

FIG. 14 is an equivalent circuit diagram for a pixel (P) of a liquid crystal display apparatus including liquid crystal (LC) serving as a display device. The pixel (P) is disposed in a display area (DA).

Referring to FIGS. 14, 15, and 16, the display apparatus 600 according to another embodiment of the present disclosure includes a substrate 310, a pixel driver (PDC) on the substrate 310, and a liquid crystal capacitor (Clc) connected with the pixel driver (PDC). Herein, the liquid crystal capacitor (Clc) corresponds to a display device.

The pixel driver (PDC) includes a first thin film transistor (TR1) connected with a gate line (GL) and a data line (DL), and a storage capacitor (Cst) connected between the first thin film transistor (TR1) and a second electrode 372 of the display device. The liquid crystal capacitor (Clc) is connected with the storage capacitor (Cst) in parallel between the first thin film transistor (TR1) and the second electrode 372. The first thin film transistor (TR1) is disposed in the display area (DA).

The liquid crystal capacitor (Clc) is charged with a difference voltage between a data signal supplied to a first electrode 371 corresponding to a pixel electrode through the first thin film transistor (TR1) and a common voltage (Vcom) supplied to the second electrode 372 corresponding to a common electrode, and controls an amount of light transmittance by driving the liquid crystal in accordance with the charged voltage. The storage capacitor (Cst) stably maintains the voltage charged in the liquid crystal capacitor (Clc).

Referring to FIG. 16, the display apparatus 600 according to another embodiment of the present disclosure includes the substrate 310, a first gate electrode (G1) on the substrate 310, a first active layer (A1) above the first gate electrode (G1), a first source electrode (S1) and a first drain electrode (D1) connected with the first active layer (A1), and the first electrode 371 connected with the first drain electrode (D1).

The substrate 310 can be formed of glass or plastic. The substrate 310 can be formed of plastic having flexibility, for example, polyimide (PI).

The gate line (GL) and the first gate electrode (G1) are disposed on the substrate 310. Referring to FIG. 15, the first gate electrode (G1) extends from the gate line (GL), and the first gate electrode (G1) and the gate line (GL) are formed as one body. The first gate electrode (G1) blocks ambient light which is incident on the first active layer (A1).

A first gate insulating film 320 is disposed on the first gate electrode (G1). The first gate insulating film 320 is formed of an insulating material, and the first gate insulating film 320 insulates the first gate electrode (G1) and the first active layer (A1) from each other.

The first active layer (A1) is disposed on the first gate insulating film 320. At least a portion of the first active layer (A1) can overlap with at least a portion of the first gate electrode (G1).

According to one embodiment of the present disclosure, the first active layer (A1) can include an oxide semiconductor material. For example, the first active layer (A1) can include at least one among IZO(InZnO)-based oxide semiconductor material, IGO(InGaO)-based oxide semiconductor material, GO(GaO)-based oxide semiconductor material, ITO(InSnO)-based oxide semiconductor material, IGZO(In-GaZnO)-based oxide semiconductor material, IGTO(In-GaSnO)-based oxide semiconductor material, IGZTO(In-GaZnSnO)-based oxide semiconductor material, GZTO (GaZnSnO)-based oxide semiconductor material, GZO (GaZnO)-based oxide semiconductor material, and ITZO (InSnZnO)-based oxide semiconductor material. However, one embodiment of the present disclosure is not limited to the above materials. The first active layers (A1) can be formed of other oxide semiconductor materials generally known to those in the art.

The first active layer (A1) can have a multi-layered structure. The first active layer (A1) can include a first oxide semiconductor layer on the first gate insulating film 320, and a second oxide semiconductor layer on the first oxide semiconductor layer.

A first source electrode (S1) and a first drain electrode (D1) are disposed on the first active layer (A1). The first source electrode (S1) and the first drain electrode (D1) are spaced apart from each other, and are respectively connected with the first active layer (A1).

At least one of the first source electrode (S1) and the first drain electrode (D1) can be connected with the data line (DL). At least one of the first source electrode (S1) and the first drain electrode (D1) can extend from the data line (DL). Referring to FIG. 15, the data line (DL) is formed as one body with the first source electrode (S1).

The first gate electrode (G1), the first active layer (A1), the first source electrode (S1), and the first drain electrode (D1) constitute the first thin film transistor (TR1).

Referring to FIG. 16 a passivation layer 340 is disposed on the first source electrode (S1) and the first drain electrode (D1). The passivation layer 340 protects the first thin film transistor (TR1).

A protection layer 350 is disposed on the passivation layer 340. The protection layer 350 is provided to planarize an upper surface of the first thin film transistor (TR1), and to protect the pixel driver (PDC), whereby the protection layer 350 can be referred to as a planarization layer.

Referring to FIG. 16, the second electrode 372 of the display device is disposed on the protection layer 350. A common voltage is applied to the second electrode 372. Thus, the second electrode 372 can be referred to as a common electrode.

An insulating interlayer 360 is disposed on the second electrode 372, and the first electrode 371 of the display device is disposed on the insulating interlayer 360.

The first electrode 371 and the second electrode 372 can be interchanged in position. In another embodiment of the present disclosure shown in FIGS. 14 to 16, the liquid crystal capacitor (Clc) serves as the display device of the display apparatus 600, and the display device includes the first electrode 371 corresponding to the pixel electrode, the second electrode 372 corresponding to the common electrode, and liquid crystal layer (LC).

Also, referring to FIGS. 15 and 16, the first electrode 371 has a line-shaped electrode type, and the second electrode 372 has a surface-shaped electrode type, but not limited to these types. For example, the first electrode 371 can have a surface-shaped electrode type, and the second electrode 372 can have a line-shaped electrode type. In another way, both the first and second electrodes 371 and 372 can have a line-shaped electrode type, or both the first and second electrodes 371 and 372 can have a surface-shaped electrode type.

Referring to FIG. 16, the first electrode 371 is connected with the first thin film transistor (TR1) via a contact hole (CH1). In detail, the first electrode 371 is in contact with the first drain electrode (D1) of the first thin film transistor (TR1) via the contact hole (CH1) formed in the insulating interlayer 360, the protection layer 350, and the passivation layer 340.

The liquid crystal layer (LC) is disposed on the first electrode 371. In detail, the liquid crystal layer (LC) is disposed between the substrate 310 and its confronting substrate 410.

Referring to FIG. 16, a color filter 420 is disposed on the confronting substrate 410, and a black matrix 430 is disposed between each color filter 420. The black matrix 430 is provided to divide each pixel area.

In FIG. 16, the color filter 420 is disposed on the confronting substrate 410, but not limited to this structure. For instance, the color filer 420 can be disposed on the substrate 310.

According to another embodiment of the present disclosure, the first thin film transistor (TR1) having a bottom gate structure occupies a small sized area, whereby it is favorable to a high integration of the thin film transistor. Thus, according to one embodiment of the present disclosure, the first thin film transistor (TR1) is disposed in the display area (DA) so that it is possible to manufacture the high-resolution display apparatus 600.

Figure 18:
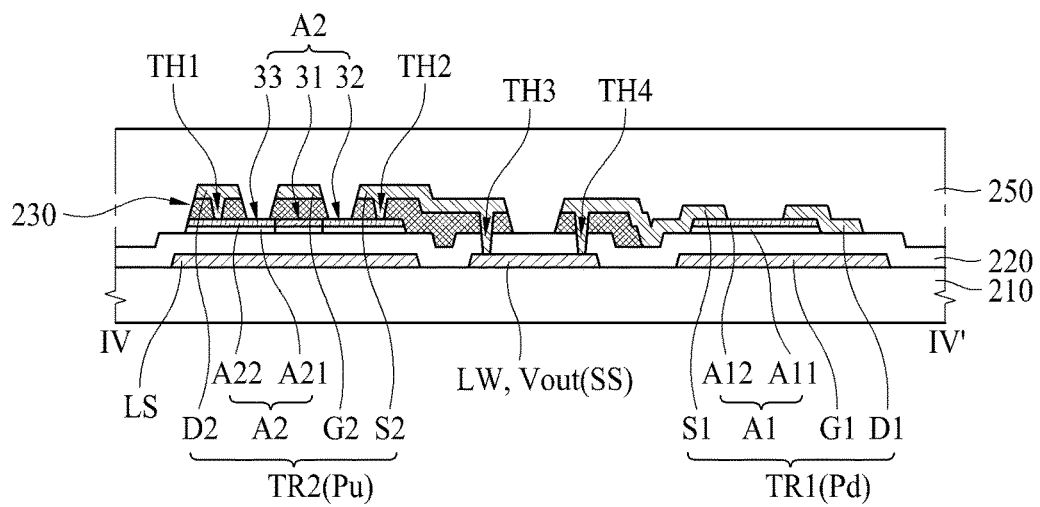
FIG. 18 is a cross sectional view along line IV-IV' of FIG. 17.

FIG. 17 is a plan view illustrating the pull-up transistor (Pu) and the pull-down transistor (Pd) shown in FIG. 3. FIG. 18 is a cross sectional view along line IV-IV' of FIG. 17.

As described above, the stage 151 which sequentially output the scan signal (SS) includes the pull-up transistor (Pu) and the pull-down transistor (Pd), as shown in FIG. 3.

The pull-up transistor (Pu) is turned-on or turned-off in accordance with a logic state of Q node. If the pull-up transistor (Pu) is turned-on, the clock signal (CLK) is supplied to the pull-up transistor (Pu), and the pull-up transistor (Pu) outputs the gate pulse (GP) [Vout(SS)]. The pull-down transistor (Pd) is connected between the pull-up transistor (Pu) and the turn-off voltage (VSS1). When the pull-up transistor (Pu) is turned-on, the pull-down transistor (Pd) is turned-off. When the pull-up transistor (Pu) is turned-off, the pull-down transistor (Pd) is turned-on, whereby the gate-off signal (Goff) is output.

Referring to FIG. 17, the pull-up transistor (Pu) has the top gate structure, and the pull-up transistor (Pu) is disposed in the non-display area (NDA). The pull-up transistor (Pu) corresponds to the second thin film transistor (T2) shown in FIGS. 5 and 6.

In FIGS. 17 and 18, the pull-down transistor (Pd) is referred to as the first thin film transistor (TR1), and the pull-up transistor (Pu) is referred to as the second thin film transistor (TR2).

Referring to FIGS. 17 and 18, the first gate electrode (G1) and the light shielding layer (LS) are disposed on the substrate 210, and the lower wiring (LW) for outputting (Vout(SS)] the gate pulse (GP) is disposed on the substrate 210.

The first gate insulating film 220 is disposed on the first gate electrode (G1), the light shielding layer (LS), and the lower wiring (LW).

The first active layer (A1) and the second active layer (A2) are disposed on the first gate insulating film 220. At least a portion of the second active layer (A2) overlaps with the light shielding layer (LS).

The first active layer (A1) and the second active layer (A2) are disposed on the same layer. According to one embodiment of the present disclosure, the first active layer (A1) and the second active layer (A2) include an oxide semiconductor material. Each of the first active layer (A1) and the second active layer (A2) includes the first oxide semiconductor layer (A11, A21), and the second oxide semiconductor layer (A12, A22) on the first oxide semiconductor layer (A11, A21).

The first source electrode (S1) and the first drain electrode (D1) are disposed on the first active layer (A1). The first source electrode (S1) and the first drain electrode (D1) are spaced apart from each other, and are respectively connected with the first active layer (A1).

Referring to FIG. 18, the second gate insulating film 230 is disposed on the second active layer. The second gate electrode (G2), the second source electrode (S2), and the second drain electrode (D2) are disposed on the second gate insulating film 230. The second source electrode (S2) and the second drain electrode (D2) are spaced apart from each other, and are respectively connected with the second active layer (A2).

Referring to FIG. 18, the second gate insulating film 230 is not disposed on the second active layer (A2) between the second source electrode (S2) and the second gate electrode (G2) and between the second drain electrode (D2) and the second gate electrode (G2). In more detail, the second gate insulating film 230 is not disposed between the second source electrode (S2) and the second gate electrode (G2) and between the second drain electrode (D2) and the second gate electrode (G2).

The second drain electrode (D2) is connected with the drain region 33 of the second active layer (A2) through a first contact hole (TH1) formed in the second gate insulating film 230.

The second source electrode (S2) is connected with the source region 32 of the second active layer (A2) through a second contact hole (TH2) formed in the second gate insulating film 230. Also, the second source electrode (S2) is connected with the lower wiring (LW) through a third contact hole (TH3) formed in the second gate insulating film 230 and the first gate insulating film 220.

The first source electrode (S1) is connected with the lower wiring (LW) through a fourth contact hole (TH4).

Referring to FIG. 17, a turn-off voltage (VSS1) is applied to the first drain electrode (D1), and a Qb node control signal is applied to the first gate electrode (G1).

When the pull-up transistor (Pu) is turned-off, the pull-down transistor (Pd) is turned-on, whereby a gate-off signal (Goff) is output to the lower wiring (LW) via the first source electrode (S1).

Referring to FIG. 17, a Q node is applied to the second gate electrode (G2), and a gate clock signal (CLK) is applied to the pull-up transistor (Pu) corresponding to the second thin film transistor (TR2) via the second drain electrode (D2).

When the pull-up transistor (Pu) is turned-on, a clock signal (CLK) is applied to the second thin film transistor (TR2), whereby a gate pulse (GP) is output to the lower wiring (LW) via the second source electrode (S2) [Vout (SS)].

The protection layer 250 is disposed on the first source electrode (S1), the first drain electrode (D1), the second gate electrode (G2), the second source electrode (S2), and the second drain electrode (D2).

The stage 151 disposed in the non-display area (NDA) includes the second thin film transistor (TR2, pull-up transistor, Pu) having the top gate structure.

A parasitic cap (Cap) is not generated between the electrodes in the second thin film transistor (T2) having the top gate structure, whereby a power consumption is small. Thus, the second thin film transistor (TR2) having the top gate structure is disposed in the non-display area (NDA) which consumes a large amount of power, so that it is possible to reduce a power consumption.

Hereinafter, a method for manufacturing the display apparatus 100 according to one embodiment of the present disclosure will be described with reference to FIGS. 19A to 19I.

FIGS. 19A to 19I are cross sectional views illustrating a method for manufacturing the display apparatus 100 according to one embodiment of the present disclosure.

Figure 19A:
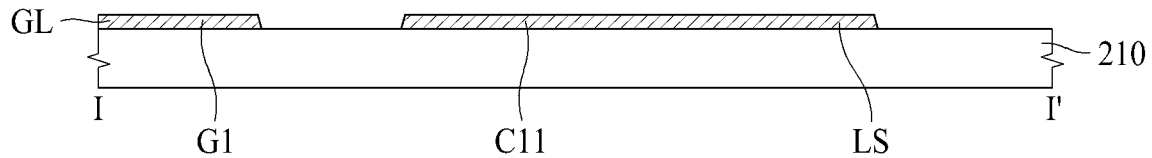
FIGS. 19A to 19I are cross sectional views illustrating a method for manufacturing the display apparatus according to one embodiment of the present disclosure.

Referring to FIG. 19A, the gate line (GL), the first gate electrode (G1), and the light shielding layer (LS) are provided on the substrate 210. The first gate electrode (G1) is formed as one body with the gate line (GL). A portion of the light shielding layer (LS) serves as the first capacitor electrode (C11) of the first capacitor (C1).

Figure 19B:
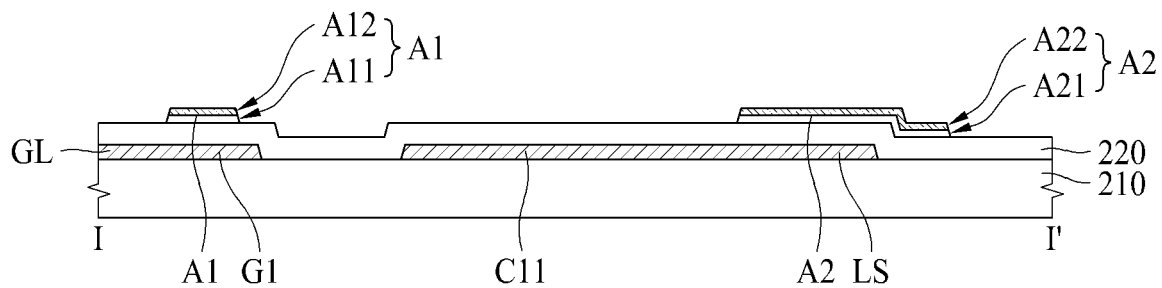

Referring to FIG. 19B, the first gate insulating film 220 is provided on the gate line (GL), the first gate electrode (G1), the light shielding layer (LS), and the first capacitor electrode (C11). The first active layer (A1) and the second active layer (A2) are provided on the first gate insulating film 220. The first active layer (A1) is overlapped with the first gate electrode (G1).

The first active layer (A1) and the second active layer (A2) can be formed by the use of oxide semiconductor material. For example, the first active layer (A1) and the second active layer (A2) include the first oxide semiconductor layer (A11, A21), and the second oxide semiconductor layer (A12, A22) on the first oxide semiconductor layer (A11, A21).

Figure 19C:
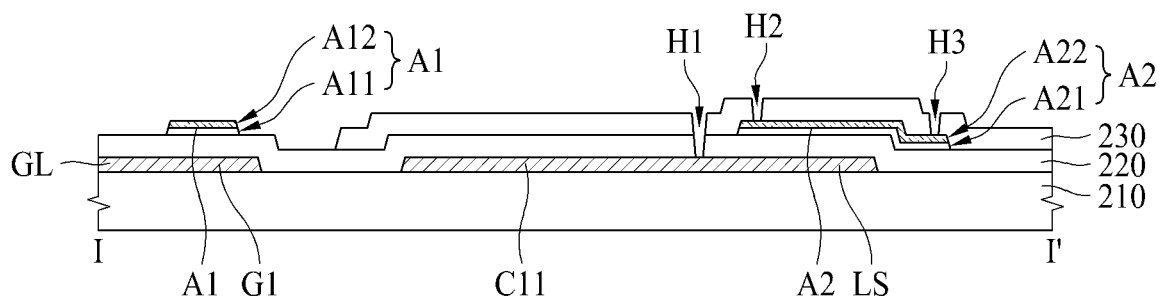

Referring to FIG. 19C, the second gate insulating film 230 is provided on the second active layer (A2). The second gate insulating film 230 is not disposed on the first active layer (A1).

For example, the second gate insulating film 230 is provided on an entire upper surface of the substrate 210, and then the second gate insulating film 230 can be removed from the area above the first active layer (A1). In this case, the first contact hole (H1), the second contact hole (H2), and the third contact hole (H3) can be manufactured at the same time.

Figure 19D:
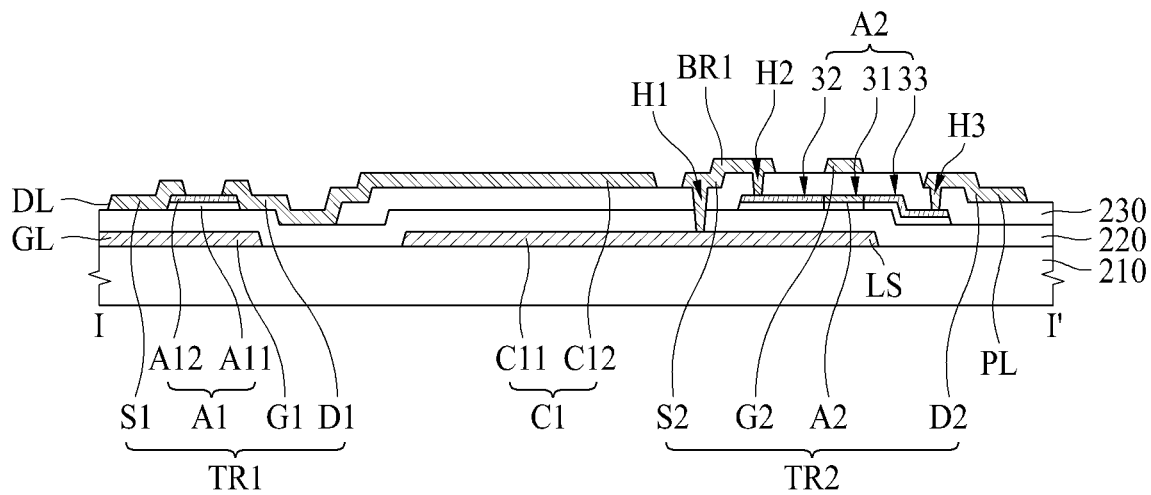

Referring to FIG. 19D, the first source electrode (S1) and the first drain electrode (D1) are formed on at least some portions of the first active layer (A1). In this case, the data line (DL) connected with the first source electrode (S1) is provided. The first drain electrode (D1) extends onto the second gate insulating film 230, to thereby form the second capacitor electrode (C12).

Also, the second gate electrode (G2), the second source electrode (S2), and the second drain electrode (D2) are provided on the second gate insulating film 230. In this case, the driving power line (PL) connected with the second drain electrode (D2) is provided.

The second source electrode (S2) and the second drain electrode (D2) are spaced apart from each other, and are respectively connected with the second active layer (A2).

In detail, the second source electrode (S2) is connected with the first capacitor electrode (C11) via the first contact hole (H1) formed in the first gate insulating film 220 and the second gate insulating film 230, and is also connected with the source region 32 of the second active layer (A2) via the second contact hole (H2) formed in the second gate insulating film 230.

The second drain electrode (D2) is connected with the drain region 33 of the second active layer (A2) via the third contact hole (H3) formed in the second gate insulating film 230.

Figure 19E:
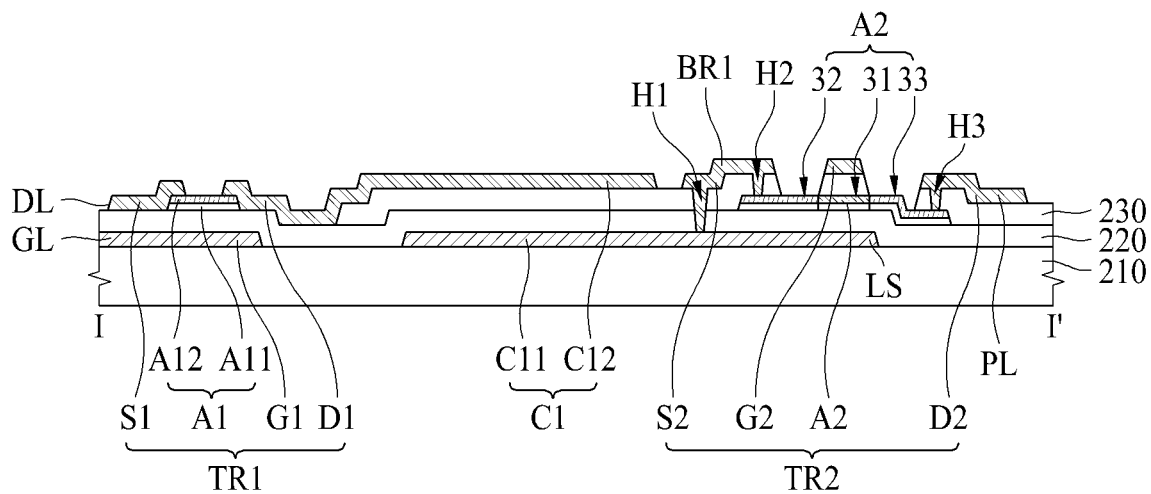

Referring to FIG. 19E, some portions of the second active layer (A2) selectively becomes the conducting regions by the selective conductivity providing process using the second gate electrode (G2) as a mask. As a result, it is possible to form the first thin film transistor (TR1) and the second thin film transistor (TR2).

According to one embodiment of the present disclosure, some portions of the second active layer (A2) are selectively provided with conductivity by a plasma treatment or a dry etching process. By the plasma treatment or the dry etching process, the second gate insulating film 230 can be removed from the area positioned between the second source electrode (S2) and the second gate electrode (G2), and between the second drain electrode (D2) and the second gate electrode (G2). As a result, the second gate insulating film 230 is not disposed on the second active layer (A2) between the second source electrode (S2) and the second gate electrode (G2), and between the second drain electrode (D2) and the second gate electrode (G2).

However, one embodiment of the present disclosure is not limited to the above. For example, some regions of the second active layer (A2) can be selectively provided with conductivity by a doping process using dopant. In this case, doped regions become the conducting regions. For the doping process, for example, at least one of boron (B) ion, phosphorous (P) ion, and fluorine (F) ion can be used.

Figure 19F:
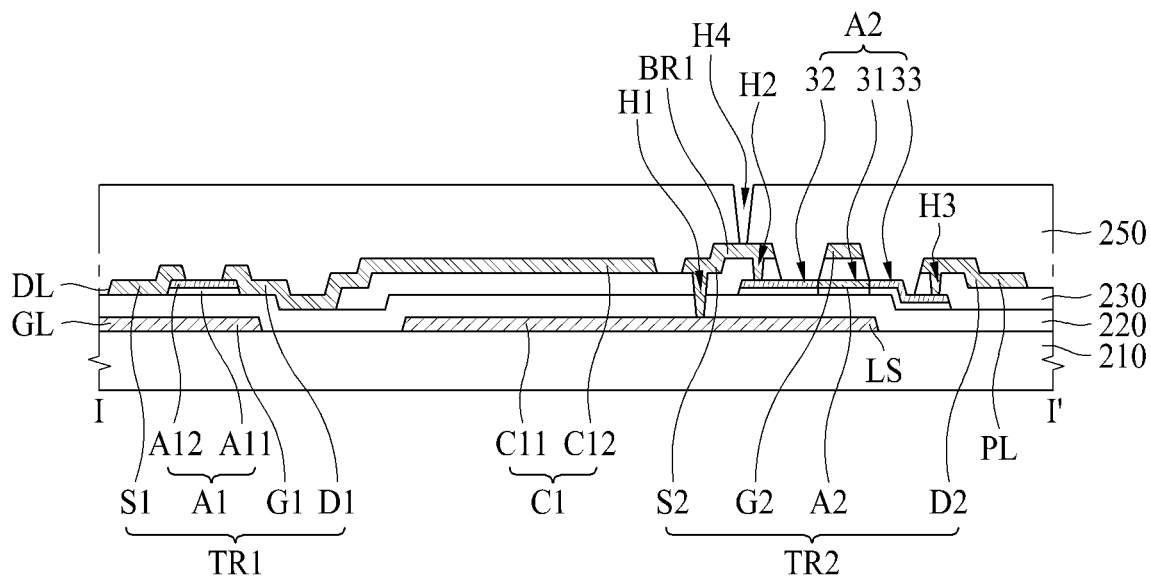

Referring to FIG. 19F, the protection layer 250 is disposed on the first thin film transistor (TR1) and the second thin film transistor (TR2). The protection layer 250 is provided to planarize upper surfaces of the first and second thin film transistors (TR1, TR2). Thus, the protection layer 250 is referred to as a planarization layer.

The fourth contact hole (H4) is provided in the protection layer 250.

Figure 19G:
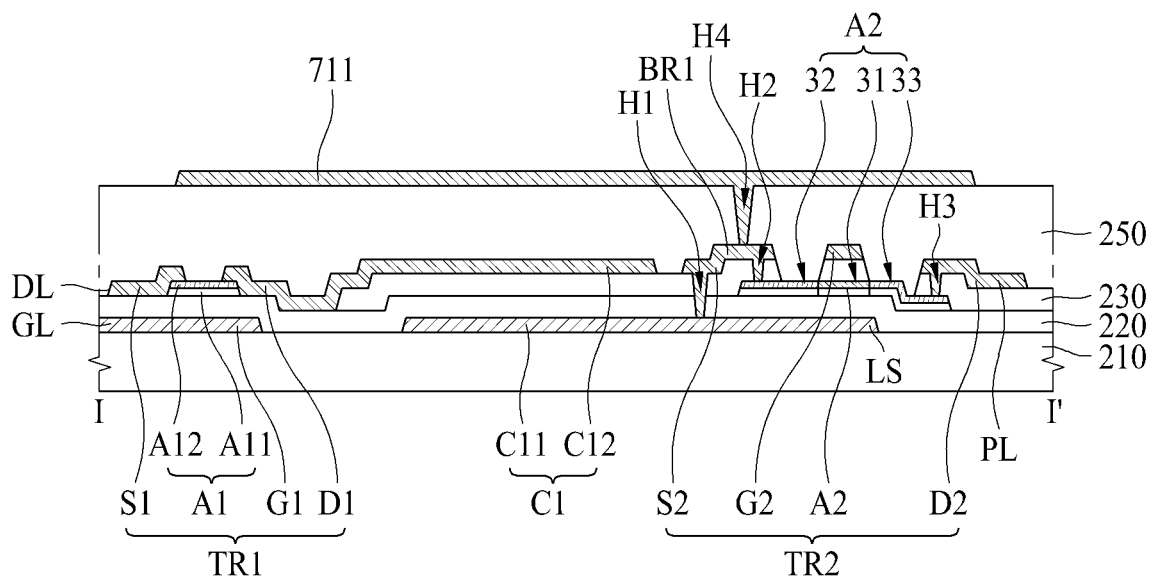

Referring to FIG. 19G, the first electrode 711 of the display device 710 is provided on the protection layer 250. The first electrode 711 is connected with the second thin film transistor (TR2) via the fourth contact hole (H4).

Figure 19H:
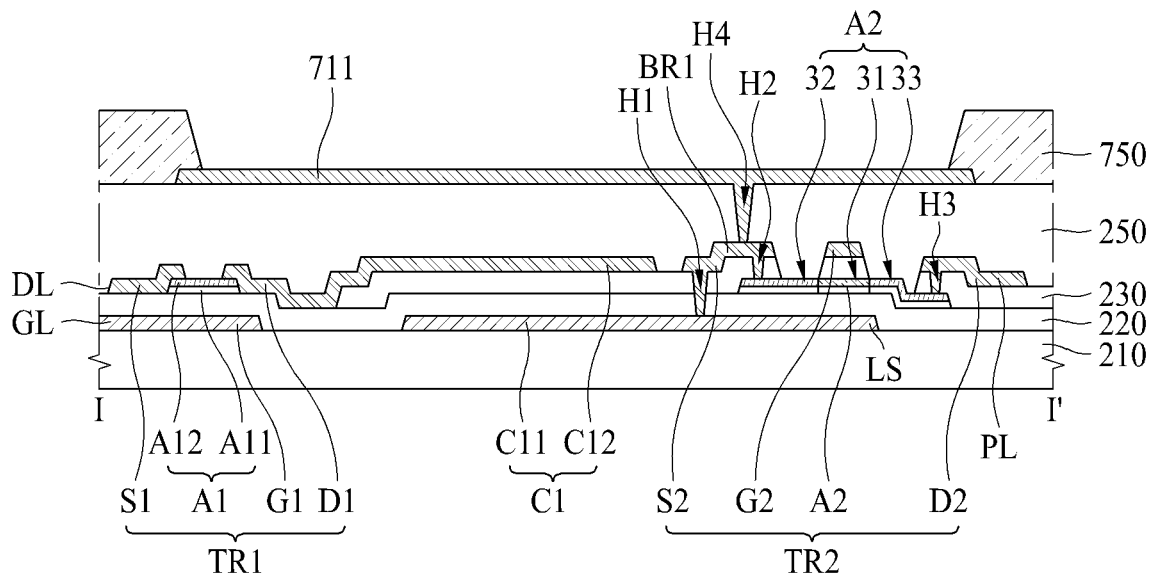

Referring to FIG. 19H, the bank layer 750 is disposed in the periphery of the first electrode 711. The bank layer 750 defines an emission area of the display device 710.

Figure 19I:
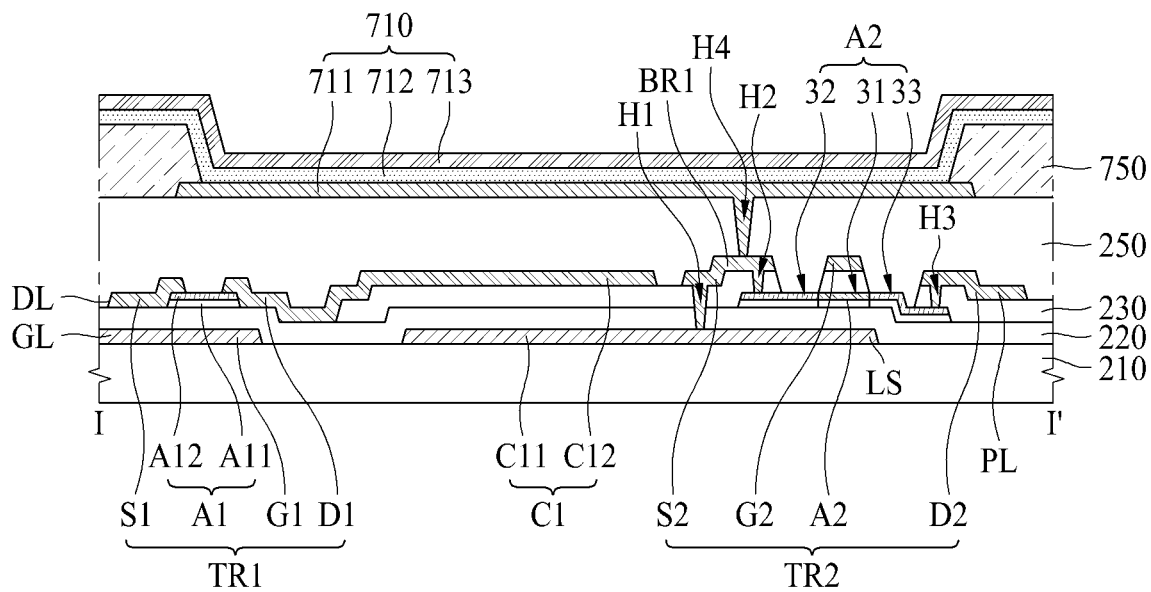

Referring to FIG. 19I, the emission layer 712 is disposed on the first electrode 711, and the second electrode 713 is disposed on the emission layer 712. Herein, the emission layer 712 is the organic emission layer including the organic material. Accordingly, it is possible to complete the display device 710. As a result, the display apparatus is completed.

In the display apparatus according to one embodiment of the present disclosure, the bottom gate type thin film transistor which occupies a small sized area is disposed in the display area so that it is possible to realize a high resolution, and the top gate type thin film transistor which is capable of realizing a small power consumption is disposed in the non-display area so that it is possible to reduce a power consumption.

According to one embodiment of the present disclosure, it is possible to manufacture a high-resolution display apparatus according as the bottom gate type thin film transistor which occupies a small sized area and enables a high integration is disposed in the display area, even though it consumes comparably a large amount of power due to a parasitic cap generated between the gate electrode and the source/drain electrode, to thereby manufacture a high-resolution display apparatus. Also, the top gate type thin film transistor which is capable of preventing an occurrence of parasitic cap, and thus realizing a small power consumption, even though it occupies comparably a large sized area, is disposed in the panel driver of the non-display area so that it is possible to reduce a power consumption of the display apparatus.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A method for manufacturing a display apparatus, the method comprising:
    providing a first gate electrode on a substrate;
    providing a first active layer which is spaced apart from the first gate electrode and overlaps with at least a portion of the first gate electrode;
    providing a second active layer on the substrate, wherein the second active layer is spaced apart from the first active layer;
    providing a first source electrode and a first drain electrode which are spaced apart from each other and are respectively connected with the first active layer;
    providing a second gate electrode which is spaced apart from the second active layer and overlaps with at least a portion of the second active layer;
    providing a second source electrode and a second drain electrode which are spaced apart from each other and are respectively connected with the second active layer; and
    selectively providing conductivity to the second active layer,
    wherein the first source electrode, the first drain electrode, the second gate electrode, the second source electrode, and the second drain electrode are manufactured at a same time.

2. The method according to claim 1, wherein the first active layer and the second active layer are formed of an oxide semiconductor material.

3. The method according to claim 2, wherein at least one of the first active layer and the second active layer includes:
    a first oxide semiconductor layer; and
    a second oxide semiconductor layer on the first oxide semiconductor layer.

4. The method according to claim 1, wherein the providing the first active layer and the providing the second active layer are carried out at a same time.

5. The method according to claim 1, further comprising:
    providing a first gate insulating film before providing the first active layer, after providing the first gate electrode; and
    providing a second gate insulating film before providing the second gate electrode, the second source electrode, and the second drain electrode, after providing the second active layer.

6. The method according to claim 5, wherein the second gate insulating film is removed from an area on the second active layer between the second source electrode and the second gate electrode and between the second drain electrode and the second gate electrode.

7. The method according to claim 1, wherein the first active layer and the second active layer are formed of a same material.

8. The method according to claim 1, wherein a first capacitor electrode is formed on the substrate when providing the first gate electrode on the substrate.

9. The method according to claim 8, wherein the first capacitor electrode and the first gate electrode are formed on a same surface of the substrate.

10. The method according to claim 1, wherein a light shielding layer is formed on the substrate when providing the first gate electrode on the substrate.

11. The method according to claim 10, wherein a portion of the light shielding layer serves as a first capacitor electrode.

12. The method according to claim 8, wherein the first drain electrode is extended to form a second capacitor electrode.

13. The method according to claim 12, wherein a second gate insulating film is formed before the first source electrode and the first drain electrode are formed, and
the first drain electrode extends onto the second gate insulating film to form the second capacitor electrode.

14. The method according to claim 8, wherein the second source electrode is connected with the first capacitor electrode.

15. The method according to claim 12, wherein the first capacitor electrode and the second capacitor electrode overlap with each other to form a first capacitor.

* * * * *